(12) United States Patent
Bates

(10) Patent No.: US 10,754,616 B1
(45) Date of Patent: Aug. 25, 2020

(54) PROCESSING WITH COMPACT ARITHMETIC PROCESSING ELEMENT

(71) Applicant: Singular Computing LLC, Newton, MA (US)

(72) Inventor: Joseph Bates, Newton, MA (US)

(73) Assignee: Singular Computing LLC, Newton, MA (US)

( * ) Notice: Subject to any disclaimer, the term of this patent is extended or adjusted under 35 U.S.C. 154(b) by 0 days.

(21) Appl. No.: 16/882,686

(22) Filed: May 25, 2020

Related U.S. Application Data

(63) Continuation of application No. 16/571,871, filed on Sep. 16, 2019, now Pat. No. 10,664,236, which is a continuation of application No. 16/175,131, filed on Oct. 30, 2018, now Pat. No. 10,416,961, which is a continuation of application No. 15/784,359, filed on Oct. 16, 2017, now Pat. No. 10,120,648, which is a continuation of application No. 14/976,852, filed on Dec. 21, 2015, now Pat. No. 9,792,088, which is a continuation of application No. 13/849,606, filed on Mar. 25, 2013, now Pat. No. 9,218,156, which is a continuation of application No. 13/399,884, filed on Feb. 17, 2012, now Pat. No. 8,407,273, which is a continuation of application No. 12/816,201, filed on Jun. 15, 2010, now Pat. No. 8,150,902.

(60) Provisional application No. 61/218,691, filed on Jun. 19, 2009.

(51) Int. Cl.
*G06F 7/483* (2006.01)
*G06F 7/38* (2006.01)
*H03K 19/17728* (2020.01)
*G06F 7/523* (2006.01)

(52) U.S. Cl.
CPC ............... *G06F 7/483* (2013.01); *G06F 7/38* (2013.01); *G06F 7/4833* (2013.01); *G06F 7/5235* (2013.01); *H03K 19/17728* (2013.01)

(58) Field of Classification Search
None
See application file for complete search history.

(56) References Cited

U.S. PATENT DOCUMENTS 5,153,848 A * 10/1992 Elkind .................... G06F 7/483
708/503
7,746,104 B1 * 6/2010 Gaide ............. H03K 19/17736
326/38
7,746,108 B1 * 6/2010 Young ............. H03K 19/17736
326/38

* cited by examiner

*Primary Examiner* — Michael D. Yaary
(74) *Attorney, Agent, or Firm* — Blueshift IP, LLC; Robert Plotkin

(57) ABSTRACT

Low precision computers can be efficient at finding possible answers to search problems. However, sometimes the task demands finding better answers than a single low precision search. A computer system augments low precision computing with a small amount of high precision computing, to improve search quality with little additional computing.

25 Claims, 11 Drawing Sheets

PROCESSING WITH COMPACT ARITHMETIC PROCESSING ELEMENT

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

The ability to compute rapidly has become enormously important to humanity. Weather and climate prediction, medical applications (such as drug design and non-invasive imaging), national defense, geological exploration, financial modeling, Internet search, network communications, scientific research in varied fields, and even the design of new computing hardware have each become dependent on the ability to rapidly perform massive amounts of calculation. Future progress, such as the computer-aided design of complex nano-scale systems or development of consumer products that can see, hear, and understand, will demand economical delivery of even greater computing power.

Gordon Moore's prediction, that computing performance per dollar would double every two years, has proved valid for over 30 years and looks likely to continue in some form. But despite this rapid exponential improvement, the reality is that the inherent computing power available from silicon has grown far more quickly than it has been made available to software. In other words, although the theoretical computing power of computing hardware has grown exponentially, the interfaces through which software is required to access the hardware limits the ability of software to use hardware to perform computations at anything approaching the hardware's theoretical maximum computing power.

Consider a modern silicon microprocessor chip containing about one billion transistors, clocked at roughly 1 GHz. On each cycle the chip delivers approximately one useful arithmetic operation to the software it is running. For instance, a value might be transferred between registers, another value might be incremented, perhaps a multiply is accomplished. This is not terribly different from what chips did 30 years ago, though the clock rates are perhaps a thousand times faster today.

Real computers are built as physical devices, and the underlying physics from which the machines are built often exhibits complex and interesting behavior. For example, a silicon MOSFET transistor is a device capable of performing interesting non-linear operations, such as exponentiation. The junction of two wires can add currents. If configured properly, a billion transistors and wires should be able to perform some significant fraction of a billion interesting computational operations within a few propagation delays of the basic components (a "cycle" if the overall design is a traditional digital design). Yet, today's CPU chips use their billion transistors to enable software to perform merely a few such operations per cycle, not the significant fraction of the billion that might be possible.

SUMMARY

Embodiments of the present invention are directed to a processor or other device, such as a programmable and/or massively parallel processor or other device, which includes processing elements designed to perform arithmetic operations (possibly but not necessarily including, for example, one or more of addition, multiplication, subtraction, and division) on numerical values of low precision but high dynamic range ("LPHDR arithmetic"). Such a processor or other device may, for example, be implemented on a single chip. Whether or not implemented on a single chip, the number of LPHDR arithmetic elements in the processor or other device in certain embodiments of the present invention significantly exceeds (e.g., by at least 20 more than three times) the number of arithmetic elements in the processor or other device which are designed to perform high dynamic range arithmetic of traditional precision (such as 32 bit or 64 bit floating point arithmetic).

In some embodiments, "low precision" processing elements perform arithmetic operations which produce results that frequently differ from exact results by at least 0.1% (one tenth of one percent). This is far worse precision than the widely used IEEE 754 single precision floating point standard. Programmable embodiments of the present invention may be programmed with algorithms that function adequately despite these unusually large relative errors. In some embodiments, the processing elements have "high dynamic range" in the sense that they are capable of operating on inputs and/or producing outputs spanning a range at least as large as from one millionth to one million.

DETAILED DESCRIPTION

Figure 1:
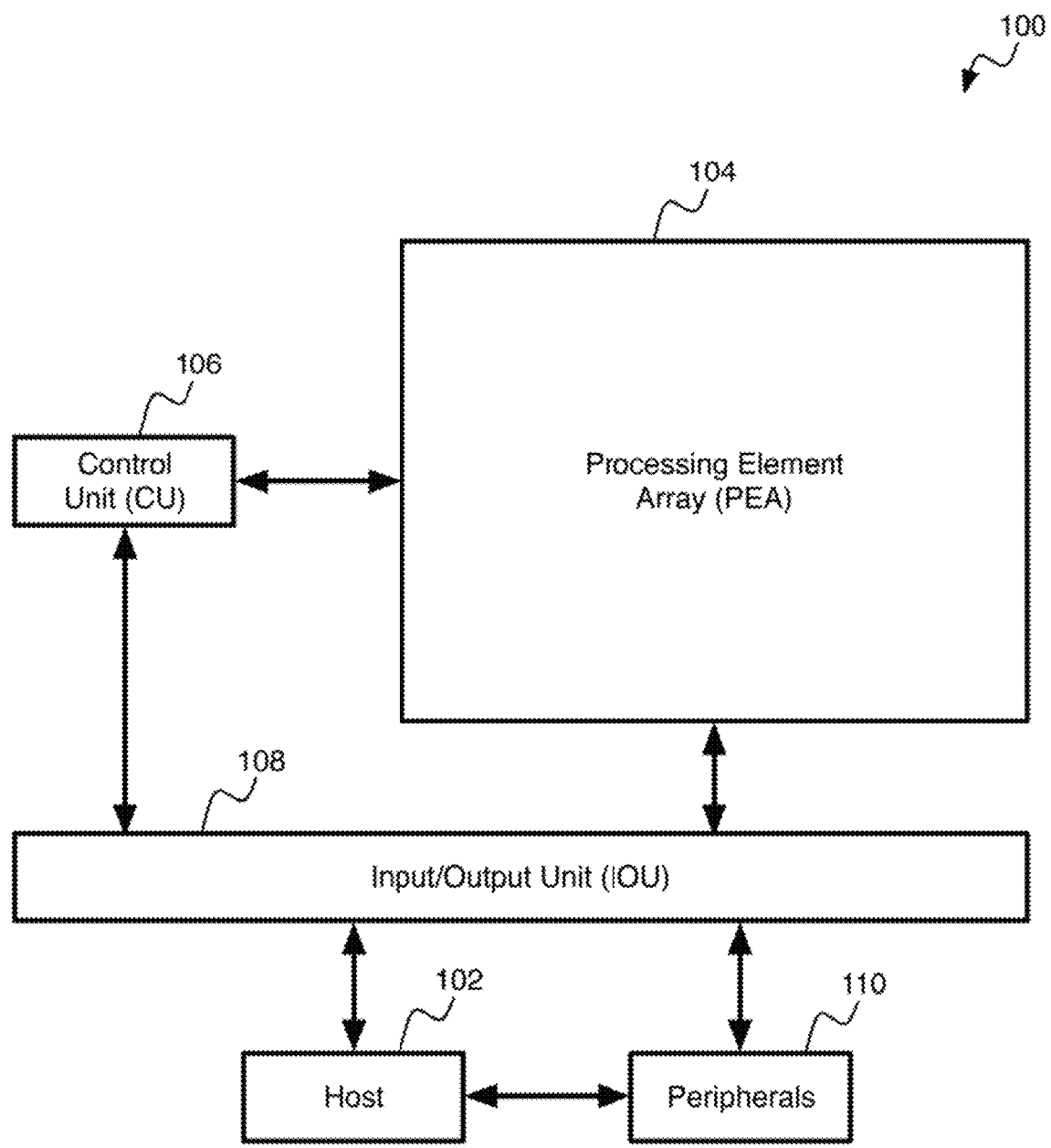
FIG. 1 is an example overall design of a SIMD processor according to one embodiment of the present invention.

As described above, today's CPU chips make inefficient use of their transistors. For example, a conventional CPU chip containing a billion transistors might enable software to perform merely a few operations per clock cycle. Although this is highly inefficient, those having ordinary skill in the art design CPUs in this way for what are widely accepted to be valid reasons. For example, such designs satisfy the (often essential) requirement for software compatibility with earlier designs. Furthermore, they deliver great precision, performing exact arithmetic with integers typically 32 or 64 bits long and performing rather accurate and widely standardized arithmetic with 32 and 64 bit floating point numbers. Many applications need this kind of precision. As a result, conventional CPUs typically are designed to provide such precision, using on the order of a million transistors to implement the arithmetic operations.

There are many economically important applications, however, which are not especially sensitive to precision and that would greatly benefit, in the form of application performance per transistor, from the ability to draw upon a far greater fraction of the computing power inherent in those million transistors. Current architectures for general purpose computing fail to deliver this power.

Because of the weaknesses of conventional computers, such as typical microprocessors, other kinds of computers have been developed to attain higher performance. These machines include single instruction stream/multiple data stream (SIMD) designs, multiple instruction stream/multiple data stream (MIMD) designs, reconfigurable architectures such as field programmable gate arrays (FPGAs), and graphics processing unit designs (GPUs) which, when applied to general purpose computing, may be viewed as single instruction stream/multiple thread (SIMT) designs.

SIMD machines follow a sequential program, with each instruction performing operations on a collection of data. They come in two main varieties: vector processors and array processors. Vector processors stream data through a processing element (or small collection of such elements). Each component of the data stream is processed similarly. Vector machines gain speed by eliminating many instruction fetch/decode operations and by pipelining the processor so that the clock speed of the operations is increased.

Array processors distribute data across a grid of processing elements (PEs). Each element has its own memory. Instructions are broadcast to the PEs from a central control until, sequentially. Each PE performs the broadcast instruction on its local data (often with the option to sit idle that cycle). Array processors gain speed by using silicon efficiently—using just one instruction fetch/decode unit to drive many small simple execution units in parallel.

Array processors have been built using fixed point arithmetic at a wide variety of bit widths, such as 1, 4, 8, and wider, and using floating point arithmetic. Small bit widths allow the processing elements to be small, which allows more of them to fit in the computer, but many operations must be carried out in sequence to perform conventional arithmetic calculations. Wider widths allow conventional arithmetic operations to be completed in a single cycle. In practice, wider widths are desirable. Machines that were originally designed with small bit widths, such as the Connection Machine-1 and the Goodyear Massively Parallel Processor, which each used 1 bit wide processing elements, evolved toward wider data paths to better support fast arithmetic, producing machines such as the Connection Machine-2 which included 32 bit floating point hardware and the MasPar machines which succeeded the Goodyear machine and provided 4 bit processing elements in the MasPar-1 and 32 bit processing elements in the MasPar-2.

Array processors also have been designed to use analog representations of numbers and analog circuits to perform computations. The SCAMP is such a machine. These machines provide low precision arithmetic, in which each operation might introduce perhaps an error of a few percentage points in its results. They also introduce noise into their computations, so the computations are not repeatable. Further, they represent only a small range of values, corresponding for instance to 8 bit fixed point values rather than providing the large dynamic range of typical 32 or 64 bit floating point representations. Given these limitations, the SCAMP was not intended as a general purpose computer, but instead was designed and used for image processing and for modeling biological early vision processes. Such applications do not require a full range of arithmetic operations in hardware, and the SCAMP, for example, omits general division and multiplication from its design.

While SIMD machines were popular in the 1980s, as price/performance for microprocessors improved designers began building machines from large collections of communicating microprocessors. These MIMD machines are fast and can have price/performance comparable to their component microprocessors, but they exhibit the same inefficiency as those components in that they deliver to their software relatively little computation per transistor.

Field Programmable Gate Arrays (FPGAs) are integrated circuits containing a large grid of general purpose digital elements with reconfigurable wiring between those elements. The elements originally were single digital gates, such as AND and OR gates, but evolved to larger elements that could, for instance, be programmed to map 6 inputs to 1 output according to any Boolean function. This architecture allows the FPGA to be configured from external sources to perform a wide variety of digital computations, which allows the device to be used as a co-processor to a CPU to accelerate computation. However, arithmetic operations such as multiplication and division on integers, and especially on floating point numbers, require many gates and can absorb a large fraction of an FPGA's general purpose resources. For this reason, modern FPGAs often devote a significant portion of their area to providing dozens or hundreds of multiplier blocks, which can be used instead of general purpose resources for computations requiring multiplication. These multiplier blocks typically perform 18 bit or wider integer multiplies, and use many transistors, as similar multiplier circuits do when they are part of a general purpose CPU.

Existing Field Programmable Analog Arrays (FPAAs) are analogous to FPGAs, but their configurable elements perform analog processing. These devices generally are intended to do signal processing, such as helping model neural circuitry. They are relatively low precision, have relatively low dynamic range, and introduce noise into computation. They have not been designed as, or intended for use as, general purpose computers. For instance, they are not seen by those having ordinary skill in the art as machines that can run the variety of complex algorithms with floating point arithmetic that typically run on high performance digital computers.

Finally, Graphics Processing Units (GPUs) are a variety of parallel processor that evolved to provide high speed graphics capabilities to personal computers. They offer standard floating point computing abilities with very high performance for certain tasks. Their computing model is sometimes based on having thousands of nearly identical threads of computing (SIMT), which are executed by a collection of SIMD-like internal computing engines, each of which is directed and redirected to perform work for which a slow external DRAM memory has provided data. Like other machines that implement standard floating point arithmetic, they use many transistors for that arithmetic. They are as wasteful of those transistors, in the sense discussed above, as are general purpose CPUs.

Some GPUs include support for 16 bit floating point values (sometimes called the "Half" format). The GPU manufacturers, currently such as NVIDIA or AMD/ATI, describe this capability as being useful for rendering images with higher dynamic range than the usual 32 bit RGBA format, which uses 8 bits of fixed point data per color, while also saving space over using 32 bit floating point for color components. The special effects movie firm Industrial Light and Magic (ILM) independently defined an identical representation in their OpenEXR standard, which they describe as "a high dynamic-range (HDR) image file format developed by Industrial Light & Magic for use in computer imaging applications." Wikipedia (late 2008) describes the 16 bit floating point representation thusly: "This format is used in several computer graphics environments including OpenEXR, OpenGL, and D3DX. The advantage over 8-bit or 16-bit binary integers is that the increased dynamic range allows for more detail to be preserved in highlights and shadows. The advantage over 32-bit single precision binary formats is that it requires half the storage and bandwidth."

When a graphics processor includes support for 16 bit floating point, that support is alongside support for 32 bit floating point, and increasingly, 64 bit floating point. That is, the 16 bit floating point format is supported for those applications that want it, but the higher precision formats also are supported because they are believed to be needed for traditional graphics applications and also for so called "general purpose" GPU applications. Thus, existing GPUs devote substantial resources to 32 (and increasingly 64) bit arithmetic and are wasteful of transistors in the sense discussed above.

The variety of architectures mentioned above are all attempts to get more performance from silicon than is available in a traditional processor design. But designers of traditional processors also have been struggling to use the enormous increase in available transistors to improve performance of their machines. These machines often are required, because of history and economics, to support large existing instruction sets, such as the Intel x86 instruction set. This is difficult, because of the law of diminishing returns, which does not enable twice the performance to be delivered by twice the transistor count. One facet of these designers' struggle has been to increase the precision of arithmetic operations, since transistors are abundant and some applications could be sped up significantly if the processor natively supported long (e.g., 64 bit) numbers. With the increase of native fixed point precision from 8 to 16 to 32 to 64 bits, and of floating point from 32 to 64 and sometimes 128 bits, programmers have come to think in terms of high precision and to develop algorithms based on the assumption that computer processors provide such precision, since it comes as an integral part of each new generation of silicon chips and thus is "free."

Embodiments of the Present Invention efficiently provide computing power using a fundamentally different approach than those described above. In particular, embodiments of the present invention are directed to computer processors or other devices which use low precision high dynamic range (LPHDR) processing elements to perform computations (such as arithmetic operations).

One variety of LPHDR arithmetic represents values from one millionth up to one million with a precision of about 0.1%. If these values were represented and manipulated using the methods of floating point arithmetic, they would have binary mantissas of no more than 10 bits plus a sign bit and binary exponents of at least 5 bits plus a sign bit. However, the circuits to multiply and divide these floating point values would be relatively large. One example of an alternative embodiment is to use a logarithmic representation of the values. In such an approach, the values require the same number of bits to represent, but multiplication and division are implemented as addition and subtraction, respectively, of the logarithmic representations. Addition and subtraction may be implemented efficiently as described below. As a result, the area of the arithmetic circuits remains relatively small and a greater number of computing elements can be fit into a given area of silicon. This means the machine can perform a greater number of operations per unit of time or per unit power, which gives it an advantage for those computations able to be expressed in the LPHDR framework.

Another embodiment is to use analog representations and processing mechanisms. Analog implementation of LPHDR arithmetic has the potential to be superior to digital implementation, because it tends to use the natural analog physics of transistors or other physical devices instead of using only the digital subset of the device's behavior. This fuller use of the devices' natural abilities may permit smaller mechanisms for doing LPHDR arithmetic. In recent years, in the field of silicon circuitry, analog methods have been supplanted by digital methods. In part, this is because of the ease of doing digital design compared to analog design. Also in part, it is because of the continued rapid scaling of digital technology ("Moore's Law") compared to analog technology. In particular, at deep submicron dimensions, analog transistors no longer work as they had in prior generations of larger-scale technology. This change of familiar behavior has made analog design still harder in recent years. However, digital transistors are in fact analog transistors used in a digital way, meaning digital circuits are really analog circuits designed to attempt to switch the transistors between completely on and completely off states. As scaling continues, even this use of transistors is starting to come face to face with the realities of analog behavior. Scaling of transistors for digital use is expected either to stall or to require digital designers increasingly to acknowledge and work with analog issues. For these reasons, digital embodiments may no longer be easy, reliable, and scalable, and analog embodiments of LPHDR arithmetic may come to dominate commercial architectures.

Because LPHDR processing elements are relatively small, a single processor or other device may include a very large number of LPHDR processing elements, adapted to operate in parallel with each other, and therefore may constitute a massively parallel LPHDR processor or other device. Such a processor or other device has not been described or practiced as a means of doing general purpose computing by those having ordinary skill in the art for at least two reasons. First, it is commonly believed by those having ordinary skill in the art, that LPHDR computation, and in particular massive amounts of LPHDR computation, whether performed in a massively parallel way or not, is not practical as a substrate for moderately general computing. Second, it is commonly believed by those having ordinary skill in the art that massive amounts of even high precision computation on a single chip or in a single machine, as is enabled by a compact arithmetic processing unit, is not useful without a corresponding increase in bandwidth between processing elements within the machine and into and out of the machine because computing is wire limited and arithmetic can be considered to be available at no cost.

Despite these views—that massive amounts of arithmetic on a chip or in a massively parallel machine are not useful, and that massive amounts of LPHDR arithmetic are even worse—embodiments of the present invention disclosed herein demonstrate that massively parallel LPHDR designs are in fact useful and provide significant practical benefits in at least several significant applications.

To conclude, modern digital computing systems provide high precision arithmetic, but that precision is costly. A modern double precision floating point multiplier may require on the order of a million transistors, even though only a handful of transistors is required to perform a low precision multiplication. Despite the common belief among those having ordinary skill in the art that modern applications require high precision processing, in fact a variety of useful algorithms function adequately at much lower precision. As a result, such algorithms may be performed by processors or other devices implemented according to embodiments of the present invention, which come closer to achieving the goal of using a few transistors to multiply and a wire junction to add, thus enabling massively parallel arithmetic computation to be performed with relatively small amounts of physical resources (such as a single silicon chip). Although certain specialized tasks can function at low precision, it is not obvious, and in fact has been viewed as clearly false by those having ordinary skill in the art, that relatively general purpose computing such as is typically performed today on general purpose computers can be done at low precision. However, in fact a variety of useful and important algorithms can be made to function adequately at much lower than 32 bit precision in a massively parallel computing framework, and certain embodiments of the present invention support such algorithms, thereby offering much more efficient use of transistors, and thereby provide improved speed, power, and/or cost, compared to conventional computers.

Various computing devices implemented according to embodiments of the present invention will now be described. Some of these embodiments may be an instance of a SIMD computer architecture. Other architectures may be used, such as MIMD architectures, programmable array architectures (such as FPGAs and FPGAs), or GPU/SIMT architectures. The techniques disclosed herein may, for example, be implemented using any processor or other device having such an existing architecture, and replacing or augmenting some or all existing arithmetic units in the processor or other device, if any, with LPHDR arithmetic units in any of the ways disclosed herein. Devices implemented according to embodiments of the present invention, however, need not start with an existing processor design, but instead may be designed from scratch to include LPHDR arithmetic units within any of the architectures just described, or any other architecture.

Embodiments of the present invention may, for example, be implemented using the architecture of a particular kind of SIMD computer, the array processor. There are many variations and specific instances of array processors described in the scientific and commercial literature. Examples include the Illiac 4, the Connection Machine 1 and 2, the Goodyear MPP, and the MasPar line of computers.

Embodiments of the present invention need not, however, be implemented as SIMD computers. For example, embodiments of the present invention may be implemented as FPGAs, FPGAs, or related architectures that provide for flexible connectivity of a set of processing elements. For example, embodiments of the present invention may be implemented as GPU/SIMTs and as MIMDs, among others. For example, embodiments of the present invention may be implemented as any kind of machine which uses LPHDR arithmetic processing elements to provide computing using a small amount of resources (e.g., transistors or volume) compared with traditional architectures. Furthermore, references herein to "processing elements" within embodiments of the present invention should be understood more generally as any kind of execution unit, whether for performing LPHDR operations or otherwise.

An example SIMD computing system 100 is illustrated in FIG. 1. The computing system 100 includes a collection of many processing elements (PEs). Sometimes present are a control unit (CU) 106, an I/O unit (IOU) 108, various Peripheral devices 110, and a Host computer 102. The collection of PEs is referred to herein as "the Processing Element Array" (PEA), even though it need not be two-dimensional or an array or grid or other particular layout. Some machines include additional components, such as an additional memory system called the "Staging Memory" in the Goodyear MPP, but these additional elements are neither essential in the computer nor needed to understand embodiments of the present invention and therefore are omitted here for clarity of explanation. One embodiment of the present invention is a SIMD computing system of the kind shown in FIG. 1, in which one or more (e.g., all) of the PEs in the PEA 104 are LPHDR elements, as that term is used herein.

The Host 102 is responsible for overall control of the computing system 100. It performs the serial, or mostly serial, computation typical of a traditional uni-processor. The Host 102 could have more complicated structure, of course, including parallelism of various sorts. Indeed a heterogeneous computing system combining multiple computing architectures in a single machine is a good use for embodiments of the present invention.

A goal of the Host 102 is to have the PEA 104 perform massive amounts of computation in a useful way. It does this by causing the PEs to perform computations, typically on data stored locally in each PE, in parallel with one another. If there are many PEs, much work gets done during each unit of time.

The PEs in the PEA 104 may be able to perform their individual computations roughly as fast as the Host 102 performs its computations. This means it may be inefficient to have the Host 102 attempt to control the PEA 104 on a time scale as fine as the Host's or PEA's minimal time step. (This minimal time, in a traditional digital design, would be the clock period.) For this reason, the specialized control unit (CU) 106 may be included in the architecture. The CU 106 has the primary task of retrieving and decoding instructions from an instruction memory, which conceptually is part of the CU 106, and issuing the partially decoded instructions to all the PEs in the PEA 104. (This may be viewed by the CU software as happening roughly simultaneously for all the PEs, though it need not literally be synchronous, and in fact it may be effective to use an asynchronous design in which multiple instructions at different stages of completion simultaneously propagate gradually across the PEA, for instance as a series of wave fronts.)

In a design which includes the CU 106, the Host 102 typically will load the instructions (the program) for the PEA 104 into the CU instruction memory (not shown in FIG. 1), then instruct the CU 106 to interpret the program and cause the PEA 104 to compute according to the instructions. The program may, for example, look generally similar to a typical machine language program, with instructions to cause data movement, logical operations, arithmetic operations, etc., in and between the PEs and other instructions to do similar operations together with control flow operations within the CU 106. Thus, the CU 106 may run a typical sort of program, but with the ability to issue massively parallel instructions to the PEA 104.

In order to get data into and out of the CU 106 and PEA 104, the I/O Unit 108 may interface the CU 106 and PEA 104 with the Host 102, the Host's memory (not shown in FIG. 1), and the system's Peripherals 110, such as external storage (e.g., disk drives), display devices for visualization of the computational results, and sometimes special high bandwidth input devices (e.g., vision sensors). The PEA's ability to process data far faster than the Host 102 makes it useful for the IOU 108 to be able to completely bypass the Host 102 for some of its data transfers. Also, the Host 102 may have its own ways of communicating with the Peripherals 110.

The particular embodiment illustrated in FIG. 1 is shown merely for purposes of example and does not constitute a limitation of the present invention. For example, alternatively the functions performed by the CU 106 could instead be performed by the Host 102 with the CU 106 omitted. The CU 106 could be implemented as hardware distant from the PEA 104 (e.g., off-chip), or the CU 106 could be near to the PEA 104 (e.g., on-chip). I/O could be routed through the CU 106 with the IOU 108 omitted or through the separate I/O unit 108, as shown. Furthermore, the Host 102 is optional; the CU 106 may include, for example, a CPU, or otherwise include components sufficient to replace the functions performed by the Host 102. The Peripherals 110 shown in FIG. 1 are optional. The design shown in FIG. 1 could have a special memory, such as the Goodyear MPP's "staging memory," which provides an intermediate level of local storage. Such memory could, for example, be bonded to the LPHDR chip using 3D fabrication technology to provide relatively fast parallel access to the memory from the PEs in the PEA 104.

Figure 2:
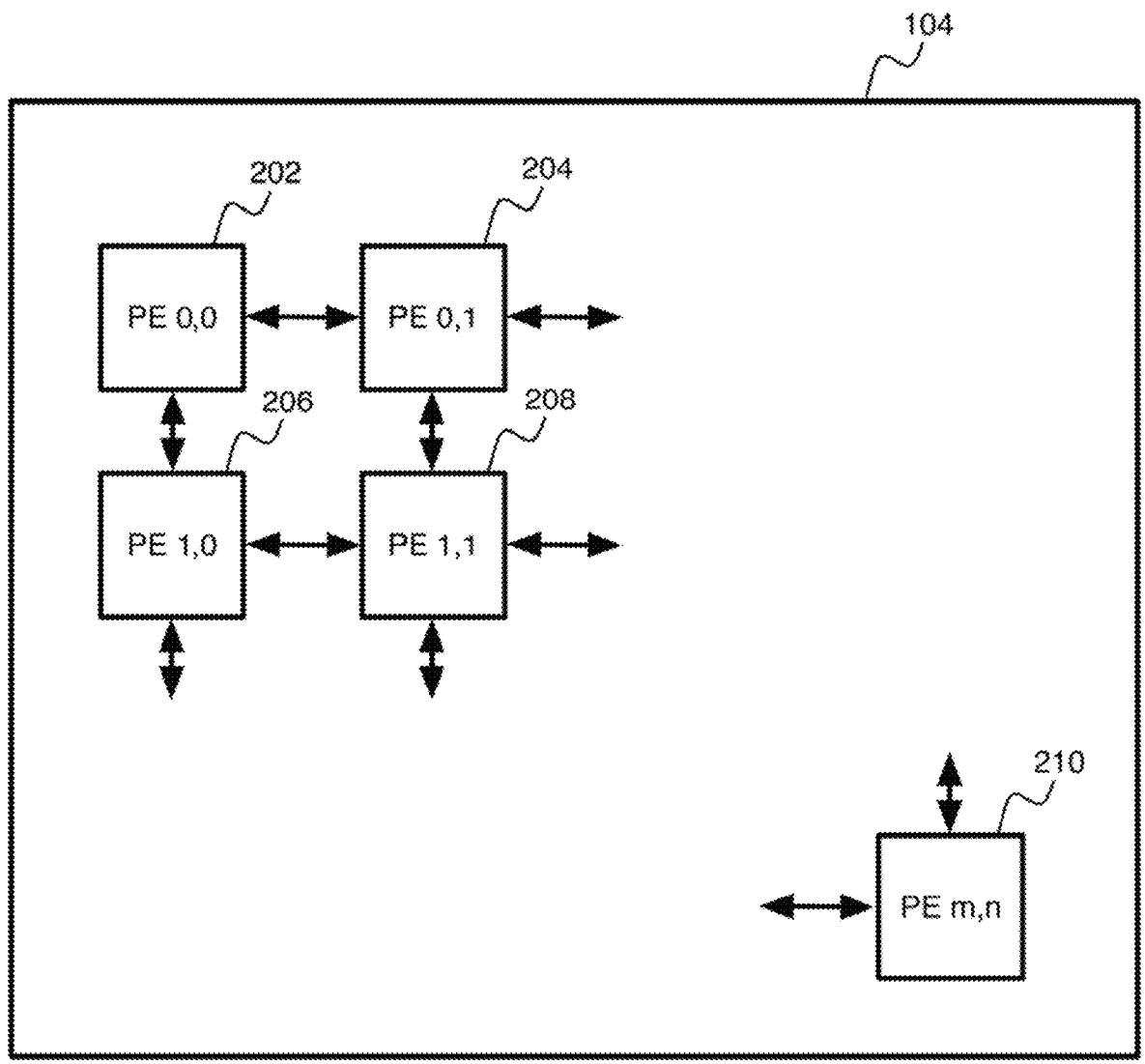
FIG. 2 is an example of the Processing Element Array of a SIMD processor according to one embodiment of the present invention.
Figure 3:
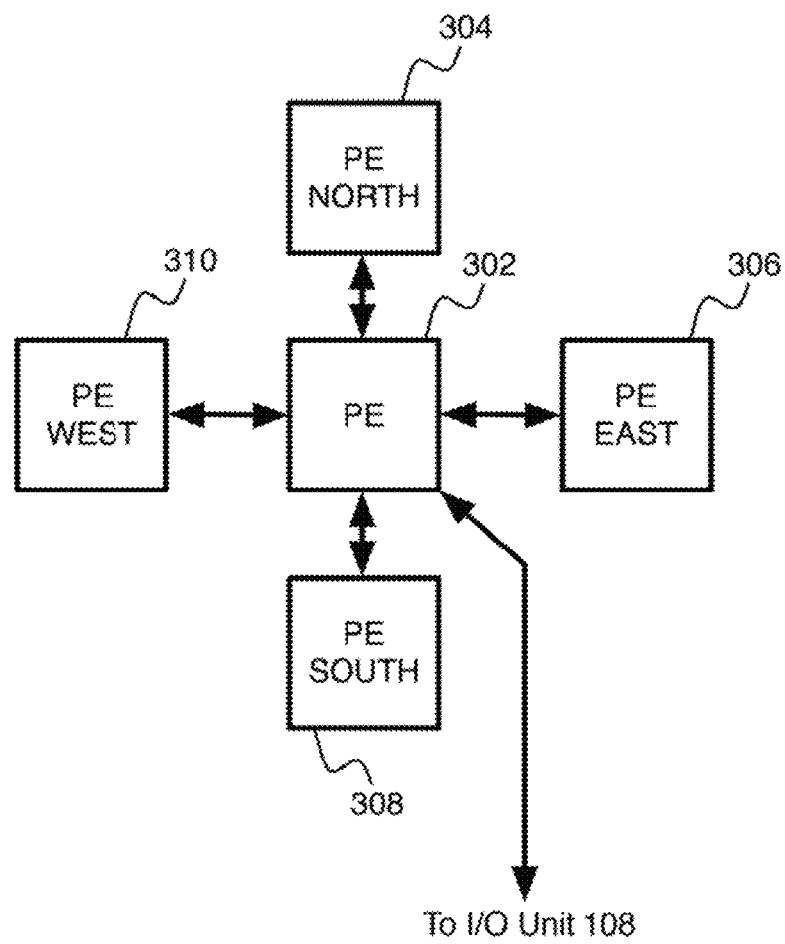
FIG. 3 is an example of how a Processing Element in a Processing Element Array communicates data with other parts of the processor according to one embodiment of the present invention.

The PEA 104 itself, besides communicating with the CU 106 and IOU 108 and possibly other mechanisms, has ways for data to move within the array. For example, the PEA 104 may be implemented such that data may move from PEs only to their nearest neighbors, that is, there are no long distance transfers. FIGS. 2 and 3 show embodiments of the present invention which use this approach, where the nearest neighbors are the four adjacent PEs toward the North, East, West, and South, called a NEWS design. For example, FIG. 2 shows a subset of the PEs in PEA 104, namely PE 202, PE 204, PE 206, PE 208, and PE 210. When the CU 106 issues data movement instructions, all the PEs access data from or send data to their respective specified nearest neighbor. For instance, every PE might access a specified data value in its neighbor to the West and copy it into its own local storage. In some embodiments, such as some analog embodiments, these kinds of transfers may result in some degradation of the value copied.

FIG. 3 shows a PE 302 that includes data connections to the IOU 108. PE 302 is connected at the North to PE 304, at the East to PE 306, at the South to PE 308, and at the West to PE 310. However, driving signals from inside the PEA 104 out to the IOU 108 usually requires a physically relatively large driving circuit or analogous mechanism. Having those at every PE may absorb much of the available resources of the hardware implementation technology (such as VLSI area). In addition, having independent connections from every PE to the IOU 108 means many such connections, and long connections, which also may absorb much of the available hardware resources. For these reasons, the connections between the PEs and the IOU 108 may be limited to those PEs at the edges of the PE array 104. In this case, to get data out of, and perhaps into, the PEA 104, the data is read and written at the edges of the array and CU instructions are performed to shift data between the edges and interior of the PEA 104. The design may permit data to be pushed from the IOU 108 inward to any PE in the array using direct connections, but may require readout to occur by using the CU 106 to shift data to the edges where it can be read by the IOU 108.

Connections between the CU 106 and PEA 104 have analogous variations. One design may include the ability to drive instructions into all the PEs roughly simultaneously, but another approach is to have the instructions flow gradually (for instance, shift in discrete time steps) across the PEA 104 to reach the PEs. Some SIMD designs, which may be implemented in embodiments of the present invention, have a facility by which a "wired-or" or "wired-and" of the state of every PE in the PEA 104 can be read by the CU 106 in approximately one instruction delay time.

There are many well studied variations on these matters in the literature, any of which may be incorporated into embodiments of the present invention. For example, an interconnect, such as an 8-way local interconnect, may be used. The local connections may include a mixture of various distance hops, such as distance 4 or 16 as well as distance 1. The outside edges may be connected using any topology, such as a torus or twisted torus. Instead of or in addition to a local interconnect, a more complex global interconnect, such as the hypercube design, may be used. Furthermore, the physical implementation of the PEA 104 (e.g., a chip) could be replicated (e.g., tiled on a circuit board) to produce a larger PEA. The replication may form a simple grid or other arrangement, just as the component PEAs may but need not be grids.

Figure 4:
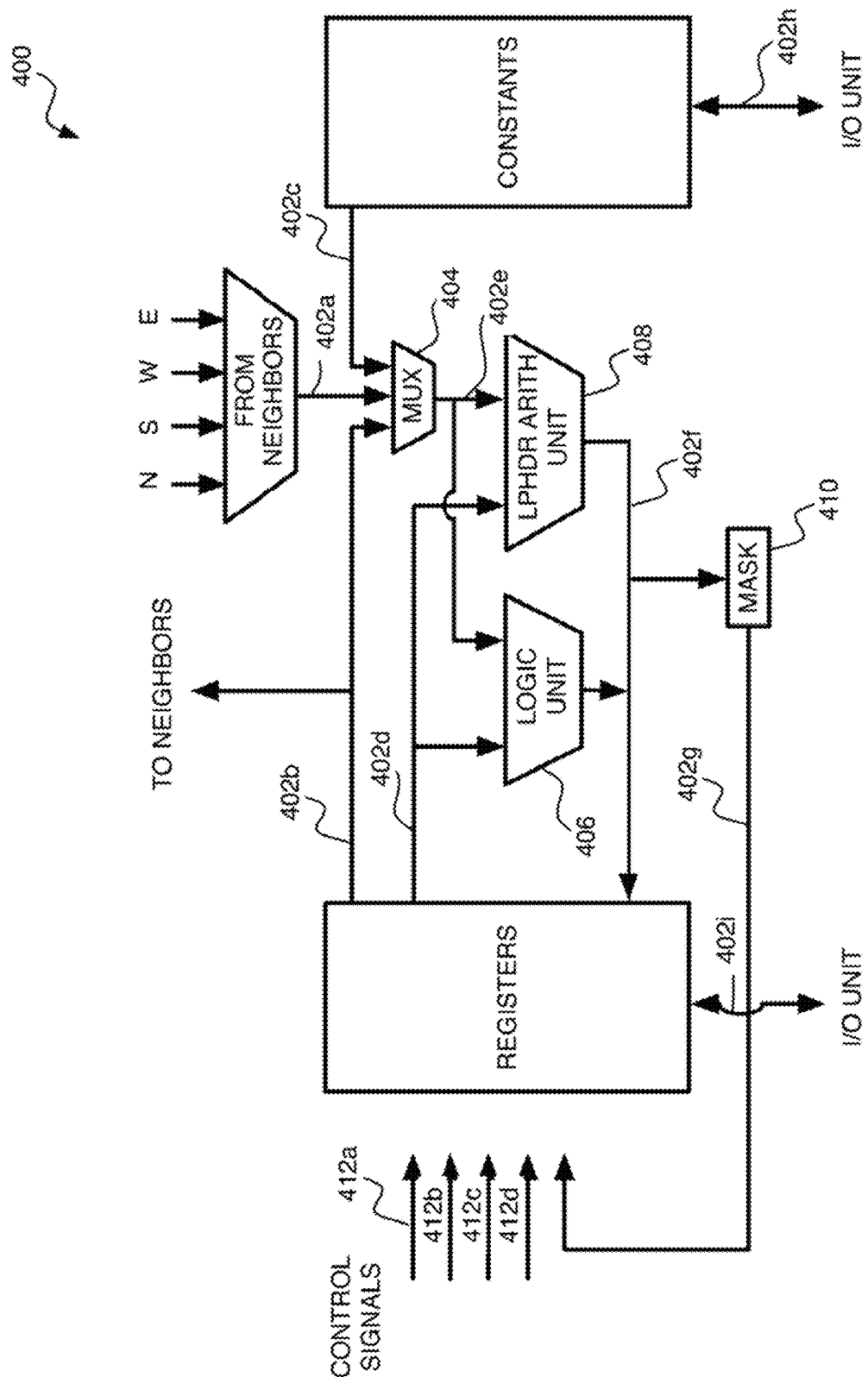
FIG. 4 is an example design for a Processing Element according to one embodiment of the present invention.

FIG. 4 shows an example design for a PE 400 (which may be used to implement any one or more of the PEs in the PEA 104). The PE 400 stores local data. The amount of memory for the local data varies significantly from design to design. It may depend on the implementation technologies available for fabricating the PE 400. Sometimes rarely changing values (Constants) take less room than frequently changing values (Registers), and a design may provide more Constants than Registers. For instance, this may be the case with digital embodiments that use single transistor cells for the Constants (e.g., floating gate Flash memory cells) and multiple transistor cells for the Registers (e.g., 6-transistor SRAM cells). Sometimes the situation is reversed, as may be the case in analog embodiments, where substantial area for capacitance may be needed to ensure stable long term storage of Constants, and such embodiments may have more Registers than Constants. Typical storage capacities might be tens or hundreds of arithmetic values stored in the Registers and Constants in each PE, but these capacities are adjustable by the designer. Some designs, for instance, may have Register storage but no Constant storage. Some designs may have thousands or even many more values stored in each PE. All of these variations may be reflected in embodiments of the present invention.

Each PE needs to operate on its local data. For this reason within the PE 400 there are data paths 402*a-i*, routing mechanisms (such as the multiplexor MUX 404), and components to perform some collection of logical and arithmetic operations (such as the logic unit 406 and the LPHDR arithmetic unit 408). The LPHDR arithmetic unit 408 performs LPHDR arithmetic operations, as that term is used herein. The input, output, and intermediate "values" received by, output by, and operated on by the PE 400 may, for example, take the form of electrical signals representing numerical values.

The PE 400 also may have one or more flag bits, shown as Mask 410 in FIG. 4. The purpose of the Mask 410 is to enable some PEs, the ones in which a specified Mask bit is set, to ignore some instructions issued by the CU 106. This allows some variation in the usual lock-step behaviors of all PEs in the PEA 104. For instance, the CU 106 may issue an instruction that causes each PE to reset or set its Mask 410 depending on whether a specified Register in the PE is positive or negative. A subsequent instruction, for instance an arithmetic instruction, may include a bit meaning that the instruction should be performed only by those PEs whose Mask 410 is reset. This combination has the effect of conditionally performing the arithmetic instruction in each PE depending on whether the specified Register in that PE was positive. As with the Compare instructions of traditional computers, there are many possible design choices for mechanisms to set and clear Masks.

The operation of the PEs is controlled by control signals 412*a-d* received from the CU 106, four of which are shown in FIG. 4 merely for purposes of example and not limitation. We have not shown details of this mechanism, but the control signals 412*a-d* specify which Register or Constant memory values in the PE 400 or one of its neighbors to send to the data paths, which operations should be performed by the Logic unit 406 or LPHDR Arithmetic Unit 408 or other processing mechanisms, where the results should be stored in the Registers, how to set, reset, and use the Mask 410, and so on. These matters are well described in the literature on SIMD processors.

Many variations of this PE 400 and PEA design are possible and fall within the scope of the present invention. Digital PEs can have shifters, lookup tables, and many other mechanisms such as described in the literature. Analog PEs can have time-based operators, filters, comparators with global broadcast signals and many other mechanisms such as described in the literature. The PEA 104 can include global mechanisms such as wired-OR or wired-AND for digital PEAs or wired-SUM for analog PEAs. Again, there are many variations well described in the literature on digital and analog computing architectures.

For example, LPHDR operations other than and/or in addition to addition and multiplication may be supported. For example, a machine which can only perform multiplication and the function (1-X) may be used to approximate addition and other arithmetic operations. Other collections of LPHDR operations may be used to approximate LPHDR arithmetic operations, such as addition, multiplication, subtraction, and division, using techniques that are well-known to those having ordinary skill in the art.

One aspect of embodiments of the present invention that is unique is the inclusion of LPHDR arithmetic mechanisms in the PEs. Embodiments of such mechanisms will now be described.

One digital embodiment of the LPHDR arithmetic unit 408 operates on digital (binary) representations of numbers. In one digital embodiment these numbers are represented by their logarithms. Such a representation is called a Logarithmic Number System (LNS), which is well-understood by those having ordinary skill in the art.

In an LNS, numbers are represented as a sign and an exponent. There is an implicit base for the logarithms, typically 2 when working with digital hardware. In the present embodiment, a base of 2 is used for purposes of example. As a result, a value, say B, is represented by its sign and a base 2 logarithm, say b, of its absolute value. For numbers to have representation errors of at most, say, 1% (one percent), the fractional part of this logarithm should be represented with enough precision that the least possible change in the fraction corresponds to about a 1% change in the value B. If fractions are represented using 6 bits, increasing or decreasing the fraction by 1 corresponds to multiplying or dividing B by the 64th root of 2, which is approximately 1.011. This means that numbers may be represented in the present embodiment with a multiplicative error of approximately 1%. So, in this example embodiment the fraction part of the representation has 6 bits.

Furthermore, the space of values processed in the present embodiment have high dynamic range. To represent numbers whose absolute value is from, say, one billionth to one billion, the integer part of the logarithm must be long enough to represent plus or minus the base 2 logarithm of one billion. That logarithm is about 29.9. In the present embodiment the integer part of the logarithm representation is 5 bits long to represent values from 0 to 31, which is sufficient. There also is a sign bit in the exponent. Negative logarithms are represented using two's complement representation.

In an LNS, the value zero corresponds to the logarithm negative infinity. One can choose a representation to explicitly represent this special value. However, to minimize resources (for instance, area) used by arithmetic circuits, the present embodiment represents zero by the most negative possible logarithm, which is −32, corresponding to the two's complement bit representation '100000 000000', and denoting a value of approximately 2.33E-10.

When computing, situations can arise in which operations cannot produce reasonable values. An example is when a number is too large to be represented in the chosen word format, such as when multiplying or adding two large numbers or upon divide by zero (or nearly zero). One common approach to this problem is to allow a value to be marked as Not A Number (NAN) and to make sure that each operation produces NAN if a problem arises or if either of its inputs is NAN. The present embodiment uses this approach, as will be described in the following.

Figure 5:
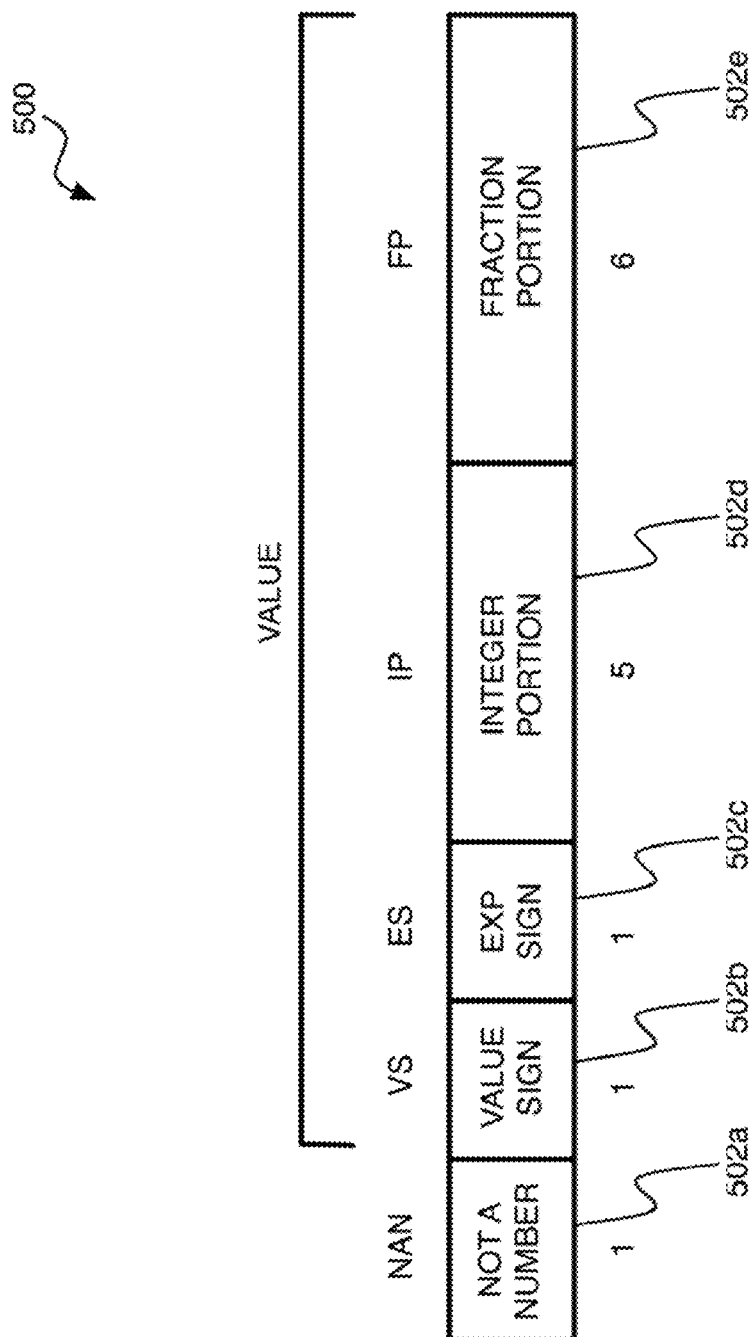
FIG. 5 is an example LPHDR data word format according to one embodiment of the present invention.

FIG. 5 shows the word format 500 for these numbers, in the present embodiment. It has one NAN bit 502*a*, one bit 502*b* for the sign of the value, and 12 bits 502*c-e* representing the logarithm. The logarithm bits include a 5 bit integer part 502*d* and a 6 bit fraction part 502*e*. To permit the logarithms to be negative, there is a sign bit 502*c* for the logarithm which is represented in two's complement form. The NAN bit is set if some problem has arisen in computing the value. The word format 500 shown in FIG. 5 is merely an example and does not constitute a limitation of the present invention. Other variations may be used, so long as they have low precision and high dynamic range.

Figure 6:
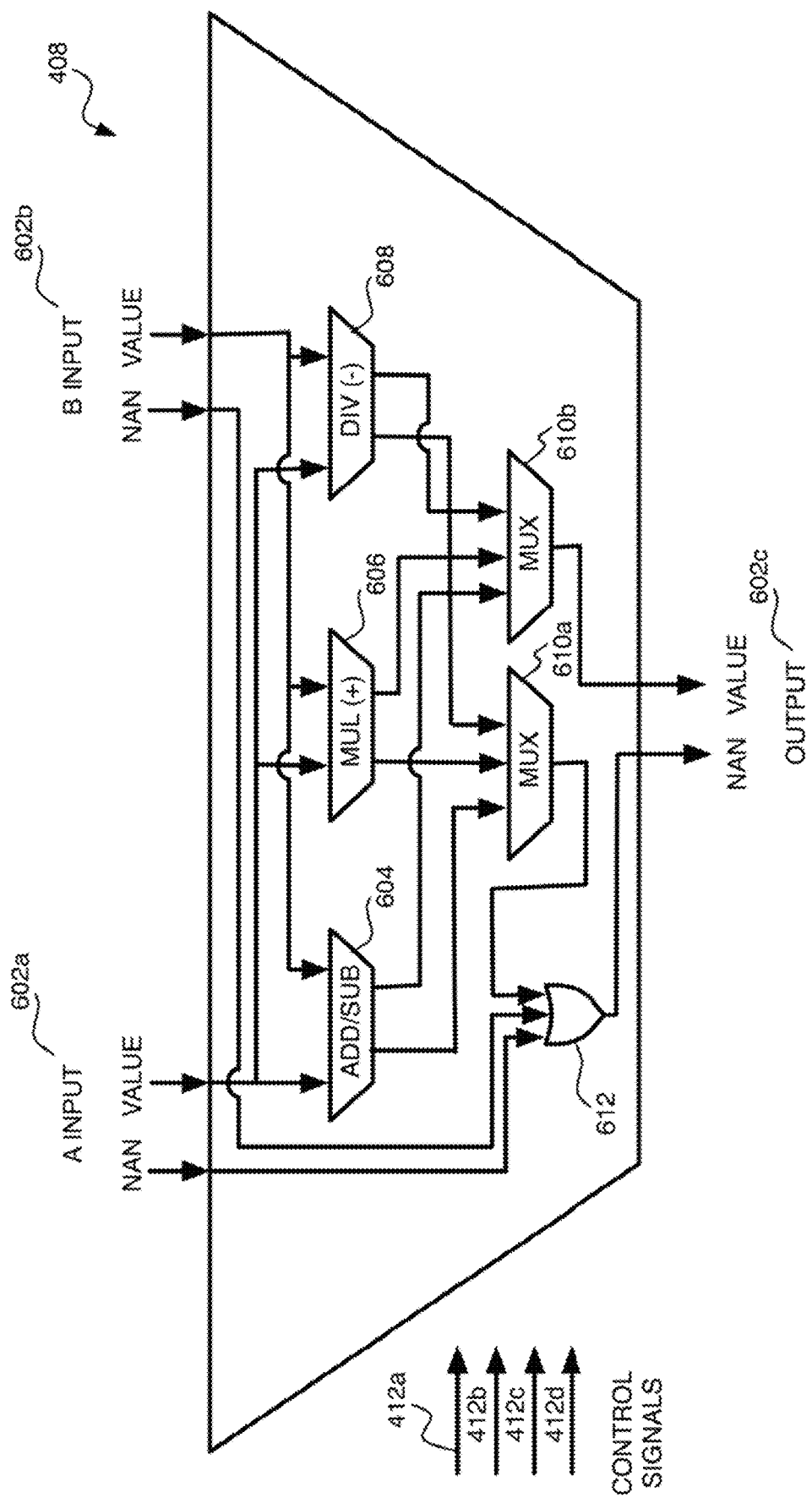
FIG. 6 is an example design for an LPHDR arithmetic unit according to one embodiment of the present invention.

FIG. 6 shows an example digital implementation of the LPHDR arithmetic unit 408 for the representation illustrated in FIG. 5. The unit 408 receives two inputs, A 602*a* and B 602*b*, and produces an output 602*c*. The inputs 602*a-b* and output 602*c* may, for example, take the form of electrical signals representing numerical values according to the representation illustrated in FIG. 5, as is also true of signals transmitted within the unit 408 by components of the unit 408. The inputs 602*a-b* and output 602*c* each are composed of a Value and a NAN (Not A Number) bit. The unit 408 is controlled by control signals 412*a-d*, coming from the CU 106, that determine which available arithmetic operation will be performed on the inputs 602*a-b*. In this embodiment, all the available arithmetic operations are performed in parallel on the inputs 602a-b by adder/subtractor 604, multiplier 606, and divider 608. Adder/subtractor 604 performs LPHDR addition and subtraction, multiplier 606 performs LPHDR multiplication, and divider 608 performs LPHDR division.

The desired result (from among the outputs of adder/subtractor 604, multiplier 606, and divider 608) is chosen by the multiplexers (MUXes) 610a and 610b. The right hand MUX 610b sends the desired value to the output 602c. The left hand MUX 610a sends the corresponding NAN bit from the desired operation to the OR gate 612, which outputs a set NAN bit if either input is NAN or if the specified arithmetic operation yields NAN. The computing architecture literature discusses many variations which may be incorporated into the embodiment illustrated in FIG. 6.

LNS arithmetic has the great advantage that multiplication (MUL) and division (DIV) are very easy to compute and take few physical resources (e.g., little area in a silicon implementation). The sign of the result is the exclusive-or of the signs of the operands. The logarithm part of the output is the sum, in the case of MUL, or the difference, in the case of DIV, of the logarithm parts of the operands. The sum or difference of the logarithms can overflow, producing a NAN result. Certain other operations also are easy in LNS arithmetic. For instance, square root corresponds to dividing the logarithm in half, which in our representation means simply shifting it one bit position to the right.

Thus, the multiplier 606 and divider 608 in FIG. 6 are implemented as circuits that simply add or subtract their inputs, which are two's complement binary numbers (which in turn happen to be logarithms). If there is overflow, they output a 1 for NAN.

Implementing addition and subtraction in LNS, that is, the adder/subtractor 604 in FIG. 6, follows a common approach used in the literature on LNS. Consider addition. If we have two positive numbers B and C represented by their logarithms b and c, the representation of the sum of B and C is log(B+C). An approach to computing this result that is well known to those skilled in the art is based on noticing that log(B+C)=log(B*(1+C/B))=log(B)+log(1+C/B)=b+F(c−b) where F(x)=log(1+2^x). Thus, the present embodiment computes c−b, feeds that through F, and adds the result to b, using standard digital techniques known to those skilled in the art.

Much of the published literature about LNS is concerned with how to compute F(x), the special function for ADD, along with a similar function for SUB. Often these two functions share circuitry, and this is why a single combined adder/subtractor 604 is used in the embodiment of FIG. 6. There are many published ways to compute these functions or approximations to them, including discussions of how to do this when the values are of low precision. Any such method, or other method, may be used. Generally speaking, the more appropriate variations for massively parallel LPHDR arithmetic are those that require the minimal use of resources, such as circuit area, taking advantage of the fact that the representation used in the embodiment of FIG. 6 is low precision and that the arithmetic operations need not be deterministic nor return the most accurate possible answer within the low precision representation. Thus, embodiments of the present invention may use circuitry that does not compute the best possible answer, even among the limited choices available in a low precision representation.

In order to enable conditional operation of selected PEs, the present embodiment is able to reset and set the MASK flag 410 based on results of computations. The mechanism for doing this is that the CU 106 includes instructions that cause the MASK 410 in each PE to unconditionally reset or set its flag along with other instructions to perform basic tests on values entering the MASK 410 on data path 402f and to set the flag accordingly. Examples of these latter instructions include copying the sign bit or NAN bit of the word on data path 402f into the MASK bit 410. Another example is to set the MASK bit 410 if the 12 bit value part of the word on data path 402f is equal to binary zero. There are many additional and alternative ways for doing this that are directly analogous to comparison instructions in traditional processors and which are well understood by those skilled in the art.

It is worth noting that while the obvious method of using the above LNS operations is to do LPHDR arithmetic, the programmer also may consider selected values to be 12 bit two's complement binary numbers. MUL and DIV may be used to add and subtract such values, since that is precisely their behavior in LNS implementations. The Mask setting instructions can compare these simple binary values. So besides doing LPHDR computations, this digital embodiment using LNS can perform simple binary arithmetic on short signed integers.

Some embodiments of the present invention may include analog representations and processing methods. Such embodiments may, for example, represent LPHDR values as charges, currents, voltages, frequencies, pulse widths, pulse densities, various forms of spikes, or in other forms not characteristic of traditional digital implementations. There are many such representations discussed in the literature, along with mechanisms for processing values so represented. Such methods, often called Analog methods, can be used to perform LPHDR arithmetic in the broad range of architectures we have discussed, of which SIMD is one example.

An example of an analog SIMD architecture is the SCAMP design (and related designs) of Dudek. In that design values have low dynamic range, being accurate roughly to within 1%. Values are represented by charges on capacitors. Those capacitors typically are the gates of transistors. Each PE has several memory cells, analogous to the Registers shown in FIG. 4. Addition is performed by turning on pass transistors from the two operands, which transfer their charge onto an analog bus, where it is summed by the natural physics of charge and wires, upon which it is gated onto another Register to charge up its capacitor, which then represents the sum of the operands. The detailed mechanism disclosed by Dudek actually produces the negative of the sum, but the basic concept is as described and is a simple way to perform addition and subtraction using analog representations and simple processing mechanisms.

Variations of the SCAMP design have been fabricated and used to perform a range of low precision, low dynamic range computations related to image processing. These designs do not perform high dynamic range arithmetic, nor do they include mechanisms for performing multiplication or division of values stored in Registers. However, the Dudek designs suggest the general feasibility of constructing analog SIMD machines. The following describes how to build an analog SIMD machine that performs LPHDR arithmetic, and is thus an embodiment of the present invention.

One embodiment of the present invention represents values as a mixture of analog and digital forms. This embodiment represents values as low precision, normalized, base 2 floating point numbers, where the mantissa is an analog value and the exponent is a binary digital value. The analog value may be accurate to about 1%, following the approach of Dudek, which is well within the range of reasonable analog processing techniques. The exponent may be 6 bits long, or whatever is needed to provide the desired high dynamic range.

To multiply values, the embodiment proceeds by analogy to traditional floating point methods. The digital exponents are summed using a binary arithmetic adder, a standard digital technique. The analog mantissas are multiplied. Since they represent normalized values between approximately ½ and 1, their product may be as small as approximately ¼. Such a product value needs to be normalized back to the range ½ to 1. This is done, in the present embodiment, by comparing the analog mantissa to an analog representation of ½, using a threshold circuit. If the mantissa is below ½, then it is doubled and one is subtracted from the exponent, where such subtraction is simple digital subtraction. Doubling the mantissa is implemented in a way that corresponds to the chosen analog representation. For example, whatever means are being used to add two analog values can be used to double the mantissa, by adding it to a copy of itself. For example, if the mantissa is represented as a current, such a copy may be produced by a current mirror, or other suitable mechanism, and addition may be performed by a current summing junction.

The means of multiplying the original analog mantissas depends on the representation chosen. For example, if mantissas are represented using charge, following SCAMP, then any known method from the literature may be used to convert charge to current. For instance, since the charge on a capacitor determines the voltage on the capacitor, this may be implemented as a conversion from voltage to current, which is a basic technique in analog electronics known to those skilled in the art. In any case, if the mantissas are represented as currents, or once the mantissas are converted to currents, they may be multiplied using, for instance, the techniques of Gilbert. The Gilbert multiplier produces a current, representing the product, which may, if necessary, then be converted back to charge (or whatever representation is used). These are merely examples of how the needed operations might be performed. The literature discusses these matters extensively and these kinds of analog circuits are known to those skilled in the art.

Adding and subtracting values requires pre-normalization of the values to the same exponent, as is done in traditional digital floating point arithmetic. The present embodiment does this by comparing the exponents and choosing the smaller one. Then the smaller one is subtracted from the larger, using digital means. The difference specifies how many times the mantissa which corresponds to the smaller exponent needs to be divided in half. If that mantissa is represented by (or converted to) a current, then an analog R-2R style ladder may be used to divide the current in half the required number of times, with the stage of the ladder specified by the difference of exponents calculated as above. The resulting scaled down current is added to (or subtracted from, if this is an LPHDR subtraction operation) the current corresponding to the mantissa associated with the larger exponent to yield the output mantissa. The output exponent associated with the output mantissa is the larger exponent. Post-normalization may be needed at this point. If the output mantissa is greater than 1, then it needs to be divided in half and the output exponent needs to be incremented. If it is less than ½, then it needs to be doubled enough times to exceed ½ and the output exponent must be decremented correspondingly, which may be performed by a series of threshold circuits, doubler circuits, and associated decrementer circuits. These increments and decrements of the binary digital exponent, and corresponding doublings and halvings of the analog mantissa current, are straightforward operations well known to those skilled in the art.

The present embodiment represents the exponent as a digital binary number. Alternate embodiments may represent the exponent as an analog value. However, it is important that the exponent be represented in storage and computation in such a manner that neither noise nor other errors cause a change in the value it represents. Such changes in the exponent could introduce factors of two (or in some embodiments larger) changes in the values of the stored numbers. To maintain accuracy of the exponents, an embodiment may quantize the exponent to relatively few levels, for instance 16 values plus a sign bit. During processing, slight variations in the analog representation of the exponent may then be removed by circuitry that restores values to the 16 standard quantization levels. To get sufficient dynamic range in such an embodiment, the floating point numbers may be processed as base 4 numbers, rather than the usual base 2 numbers. This means, for instance, that normalized mantissas are in the range ¼ to 1. The methods discussed above for addition, subtraction, and multiplication apply as described, with slight and straightforward variations.

The analog and mixed signal embodiments discussed above are merely examples and do not constitute a limitation of the present invention. The published literature on neuromorphic, analog, and mixed signal techniques provides a wealth of methods that enable LPHDR storage and processing to be implemented. Such storage and processing may introduce noise as well as fabrication errors into the behavior of machines performing LPHDR arithmetic. The results we present below, on software applications running using "fp+noise" arithmetic, show that despite these very "undigital" qualities a machine built in this way is surprisingly useful.

Evidence that LPHDR arithmetic is useful in several important practical computing applications will now be provided. The evidence is presented for a broad variety of embodiments of the present invention, thereby showing that the usefulness does not depend much on the detailed implementation.

For the goal of showing usefulness, we choose a very general embodiment of an LPHDR machine. Our model of the machine is that it provides at least the following capabilities: (1) is massively parallel, (2) provides LPHDR arithmetic possibly with noise, (3) provides a small amount of memory local to each arithmetic unit, (4) provides the arithmetic/memory units in a two-dimensional physical layout with only local connections between units (rather than some more powerful, flexible, or sophisticated connection mechanism), and (5) provides only limited bandwidth between the machine and the host machine. Note that this model is merely an example which is used for the purpose of demonstrating the utility of various embodiments of the present invention, and does not constitute a limitation of the present invention. This model includes, among others, implementations that are digital or analog or mixed, have zero or more noise, have architectures which are FPGA-like, or SIMD-like, or MIMD-like, or otherwise meet the assumptions of the model. More general architectures, such as shared memory designs, GPU-like designs, or other sophisticated designs subsume this model's capabilities, and so LPHDR arithmetic in those architectures also is useful. While we are thus showing that LPHDR arithmetic is useful for a broad range of designs, of which SIMD is only an instance, for purpose of discussion below, we call each unit, which pairs memory with arithmetic, a Processing Element or "PE".

Several applications are discussed below. For each, the discussion shows (1) that the results are useful when computation is performed in possibly noisy LPHDR arithmetic, and (2) that the computation can be physically laid out in two dimensions with only local flow of data between units, only limited memory within each unit, and only limited data flow to/from the host machine, in such a way that the computation makes efficient use of the machine's resources (area, time, power). The first requirement is referred to as "Accuracy" and the second requirement "Efficiency." Applications that meet both requirements running in this model will function well on many kinds of LPHDR machines, and thus those machines are a broadly useful invention.

Applications are tested using two embodiments for the machine's arithmetic. One uses accurate floating point arithmetic but multiplies the result of each arithmetic operation by a uniformly chosen random number between 0.99 and 1.01. In the following discussion, this embodiment is denoted "fp+noise". It may represent the results produced by an analog embodiment of the machine.

A second embodiment uses logarithmic arithmetic with a value representation as shown in FIG. 5. The arithmetic is repeatable, that is, not noisy, but because of the short fraction size it produces errors of up to approximately 1-2% in each operation. In the following discussion, this embodiment is denoted "lns". It may represent the results produced by a particular digital embodiment of the machine.

To demonstrate usefulness of embodiments of the invention, we shall discuss three computational tasks that are enabled by embodiments of the invention and which in turn enable a variety of practical applications. Two of the tasks are related to finding nearest neighbors and the other is related to processing visual information. We shall describe the tasks, note their practical application, and then demonstrate that each task is solvable using the general model described above and thus solvable using embodiments of the present invention.

Application 1: Finding Nearest Neighbors

Given a large set of vectors, called Examples, and a given vector, called Test, the nearest neighbor problem ("NN") is to find the Example which is closest to Test where the distance metric is the square of the Euclidean distance (sum of squares of distances between respective components).

NN is a widely useful computation. One use is for data compression, where it is called "vector quantization". In this application we have a set of relatively long vectors in a "code book" (these are the Examples) and associated short code words (for instance the index of the vector in the code book). We move through a sequence of vectors to be compressed, and for each such vector (Test), find the nearest vector in the code book and output the corresponding code word. This reduces the sequence of vectors to the shorter sequence of code words. Because the code words do not completely specify the original sequence of vectors, this is a lossy form of data compression. Among other applications, it may be used in speech compression and in the MPEG standards.

Another application of NN would be in determining whether snippets of video occur in a large video database. Here we might abstract frames of video from the snippet into feature vectors, using known methods, such as color histograms, scale invariant feature extraction, etc. The Examples would be analogous feature vectors extracted from the video database. We would like to know whether any vector from the snippet was close to any vector from the database, which NN can help us decide.

In many applications of nearest neighbor, we would prefer to find the true nearest neighbor but it is acceptable if we sometimes find another neighbor that is only slightly farther away or if we almost always find the true nearest neighbor. Thus, an approximate solution to the nearest neighbor problem is useful, especially if it can be computed especially quickly, or at low power, or with some other advantage compared to an exact solution.

We shall now show that approximate nearest neighbor is computable using embodiments of the present invention in a way that meets the criteria of Accuracy and Efficiency.

Algorithm.

The following describes an algorithm which may be performed by machines implemented according to embodiments of the present invention, such as by executing software including instructions for performing the algorithm. The inputs to the algorithm are a set of Examples and a Test vector. The algorithm seeks to find the nearest (or almost nearest) Example to the Test.

In the simplest version of the algorithm, the number of Examples may be no larger than the number of PEs and each vector must be short enough to fit within a single PE's memory. The Examples are placed into the memories associated with the PEs, so that one Example is placed in each PE. Given a Test, the Test is passed through all the PEs, in turn. Accompanying the Test as it passes through the PEs is the distance from the Test to the nearest Example found so far, along with information that indicates what PE (and thus what Example) yielded that nearest Example found so far. Each PE computes the distance between the Test and the Example stored in that PE's memory, and then passes along the Test together with either the distance and indicator that was passed into this PE (if the distance computed by this PE exceeded the distance passed into the PE) or the distance this PE computed along with information indicating this PE's Example is the nearest so far (if the distance computed by this PE is less than the distance passed into the PE). Thus, the algorithm is doing a simple minimization operation as the Test is passed through the set of PEs. When the Test and associated information leave the last PE, the output is a representation of which PE (and Example) was closest to the Test, along with the distance between that Example and the Test.

In a more efficient variant of this algorithm, the Test is first passed along, for example, the top row, then every column passes the Test and associated information downward, effectively doing a search in parallel with other columns, and once the information reaches the bottom it passes across the bottom row computing a minimum distance Example of all the columns processed so far as it passes across the row. This means that the time required to process the Test is proportional to (the greater of) the number of PEs in a row or column.

An enhancement of this algorithm proceeds as above but computes and passes along information indicating both the nearest and the second nearest Example found so far. When this information exits the array of PEs, the digital processor that is hosting the PE array computes (in high precision) the distance between the Test and the two Examples indicated by the PE array, and the nearer of the two is output as the likely nearest neighbor to the Test.

Accuracy.

We expressed the arithmetic performed by the enhanced algorithm described above as code in the C programming language. That code computes both nearest neighbors, which are discussed here, along with weighted scores, which are discussed below.

The C code performs the same set of arithmetic operations in the same order using the same methods of performing arithmetic as an actual implementation of the present invention, such as one implemented in hardware. It thus yields the same results as the enhanced algorithm would yield when running on an implementation of the present invention. (How the algorithm is organized to run efficiently on such an implementation is discussed below in the section on Efficiency.)

In particular, when computing the distance between the Test and each Example, the code uses Kahan's method, discussed below, to perform the possibly long summation required to form the sum of the squares of the distances between vector components of the Test and Example.

The C code contains several implementations for arithmetic, as discussed above. When compiled with "# define fp" the arithmetic is done using IEEE standard floating point. If a command line argument is passed in to enable noisy arithmetic, then random noise is added to the result of every calculation. This is the "fp+noise" form of arithmetic. When compiled without "# define fp" the arithmetic is done using low precision logarithmic arithmetic with a 6 bit base-2 fraction. This is the "lns" form of arithmetic.

When the code was run it produced traces showing the results of the computations it performed. These traces, shown below, show that with certain command line arguments the enhanced algorithm yielded certain results for LPHDR nearest neighbor calculations. These results provide details showing the usefulness of this approach. We shall discuss the results briefly here.

The first results are for "fp+noise". Ten distinct runs were performed. Each run generated one million random Example vectors of length five, where each component of each vector was drawn from N(0,1)—the Gaussian (normal) distribution with mean zero and standard deviation 1. Each run then generated one hundred Test vectors of length five, where each component of each vector also was drawn from N(0,1). For each Test, the nearest neighbor was computed both according to the enhanced algorithm above and according to the standard nearest neighbor method using high precision floating point arithmetic. A count was kept of the number of times the enhanced algorithm yielded the same result as the standard floating point method. The results were as follows:

% ./a. out 5 10 1000000 100 1

Representation is Floating Point with noise.

Run 1. On 100 tests, 100(100.0%) matches and 0.81% mean score error.

Run 2. On 100 tests, 100(100.0%) matches and 0.84% mean score error.

Run 3. On 100 tests, 100(100.0%) matches and 0.98% mean score error.

Run 4. On 100 tests, 100(100.0%) matches and 0.81% mean score error.

Run 5. On 100 tests, 100(100.0%) matches and 0.94% mean score error.

Run 6. On 100 tests, 100(100.0%) matches and 0.82% mean score error.

Run 7. On 100 tests, 100(100.0%) matches and 0.78% mean score error.

Run 8. On 100 tests, 100(100.0%) matches and 0.86% mean score error.

Run 9. On 100 tests, 100(100.0%) matches and 0.85% mean score error.

Run 10. On 100 tests, 99(99.0%) matches and 0.86% mean score error.

Average percentage of time LPHDR (with final DP correction) finds nearest example=99.90%.

Average score error between LPHDR and DP=0.85%.

The "mean score error" values are considered below in the discussion of weighted scores. The "matches" information is relevant here.

Of the ten runs, only one had any test, of the 100 tests performed, which yielded a nearest neighbor different from what the usual high precision method yielded. Thus, the average percentage of matches between the enhanced algorithm running with "fp+noise" arithmetic and the usual method was 99.9%.

A similar computation was then performed using "lns" arithmetic. In this case, the results were:

% ./a. out 5 10 1000000 100 0

Representation is LNS without noise.

Run 1. On 100 tests, 100(100.0%) matches and 0.15% mean score error.

Run 2. On 100 tests, 100(100.0%) matches and 0.07% mean score error.

Run 3. On 100 tests, 100(100.0%) matches and 0.08% mean score error.

Run 4. On 100 tests, 100(100.0%) matches and 0.09% mean score error.

Run 5. On 100 tests, 100(100.0%) matches and 0.11% mean score error.

Run 6. On 100 tests, 100(100.0%) matches and 0.16% mean score error.

Run 7. On 100 tests, 100(100.0%) matches and 0.07% mean score error.

Run 8. On 100 tests, 100(100.0%) matches and 0.13% mean score error.

Run 9. On 100 tests, 99(99.0%) matches and 0.17% mean score error.

Run 10. On 100 tests, 98(98.0%) matches and 0.16% mean score error.

Average percentage of time LPHDR (with final DP correction) finds nearest example=99.70%.

Average score error between LPHDR and DP=0.12%.

The average percentage of matches was 99.7%, slightly worse than for "fp+noise".

The accuracy shown by the enhanced nearest neighbor algorithm using two forms of LPHDR arithmetic is surprising. To perform many calculations sequentially with 1% error and yet produce a final result with less than 1% error may seem counter-intuitive. Nonetheless, the LPHDR arithmetic proves effective, and the accuracy shown is high enough to be useful in applications for which approximate nearest neighbor calculations are useful.

As an extreme case, a variant of fp+noise was tested in which the noise varied uniformly from +10% to −5%. Thus, each arithmetic operation produced a result that was between 10% too large and 5% too small. The enhanced nearest neighbor algorithm, as described above, was performed where each run generated 100,000 Example vectors. The surprising results, below, show that even with this extreme level of imprecise, noisy, and non-zero mean LPHDR arithmetic, useful results can be achieved.

Run 1. On 100 tests, 97(97.0%) matches.

Run 2. On 100 tests, 100(100.0%) matches.

Run 3. On 100 tests, 100(100.0%) matches.

Run 4. On 100 tests, 98(98.0%) matches.

Run 5. On 100 tests, 98(98.0%) matches.

Run 6. On 100 tests, 99(99.0%) matches.

Run 7. On 100 tests, 99(99.0%) matches.

Run 8. On 100 tests, 99(99.0%) matches.
Run 9. On 100 tests, 99(99.0%) matches.
Run 10. On 100 tests, 99(99.0%) matches.
Average percentage of time LPHDR (with final DP correction) finds nearest example=98.80%.

Efficiency.

In contrast to the surprising Accuracy results, it is clear to those having ordinary skill in the art that the calculations of the enhanced nearest neighbor algorithm can be performed efficiently in the computing model presented, where the arithmetic/memory units are connected in a two-dimensional physical layout, using only local communication between PEs. However, this does not address the matter of keeping the machine busy doing useful work using only low bandwidth to the host machine.

When computing the nearest neighbor to a single Test, the Test flows across all the PEs in the array. As discussed above, if the array is an M×M grid, it takes at least O(M) steps for the Test to pass through the machine and return results to the host. During this time the machine performs O(M×M) nearest neighbor distance computations, but since the machine is capable of performing O(M×M) calculations at each step, a factor of O(M) is lost.

This speedup, compared to a serial machine, of a factor of O(M) is significant and useful. However, the efficiency can be even higher. If sufficiently many Test vectors, say O(M), or more, are to be processed then they can be streamed into the machine and made to flow through in a pipelined fashion. The time to process O(M) Tests remains O(M), the same as for a single Test, but now the machine performs O(M)×O(M×M) distance computations, and thus within a constant factor the full computing capacity of the machine is used.

Thus, the machine is especially efficient if it is processing at least as many Test vectors as the square root of the number of PEs. There are applications that fit well into this form, such as pattern recognition or compression of many independent Tests (e.g., blocks of an image, parts of a file, price histories of independent stocks) as well as the problem of finding the nearest neighbor to every Example in the set of Examples. This is in contrast to the general view among those having ordinary skill in the art, as discussed above, that machines with very many arithmetic processing elements on a single chip, or similar, are not very useful.

Application 2: Distance Weighted Scoring

A task related to Nearest Neighbor is Distance Weighted Scoring. In this task, each Example has an associated Score. This is a number that in some way characterizes the Example. For instance, if the Examples are abstractions of the history of prices of a given stock, the Scores might be historical probabilities of whether the price is about to increase or decrease. Given a Test vector, the task is to form a weighted sum of the Scores of all the Examples, where the weights are a diminishing function of the distance from the Test to the respective Examples. For example, this weighted score might be taken as a prediction of the future price of the stock whose history is represented by the Test. This use of embodiments of the invention might help support, for instance, high speed trading of stocks, as is performed by certain "quantitative" hedge funds, despite the general view by those having ordinary skill in the art that low precision computation is not of use in financial applications.

The C code described above computes weighted scores along with nearest neighbors. The scores assigned to Examples in this computation are random numbers drawn uniformly from the range [0,1]. The weight for each Example in this computation is defined to be the un-normalized weight for the Example divided by the sum of the un-normalized weights for all Examples, where the un-normalized weight for each Example is defined to be the reciprocal of the sum of one plus the squared distance from the Example to the Test vector. As discussed above, the code performs a number of runs, each producing many Examples and Tests, and compares results of traditional floating point computations with results calculated using fp+noise and lns arithmetic.

Looking again at the trace results of running the simulation, above, we see that for fp+noise the LPHDR weighted scores on average were within 0.85% of the correct value and never were as much as 1% different. For lns arithmetic the errors were even smaller, averaging just 0.12% error.

These results are surprising given that computing an overall weighted score involves summing the individual weighted scores associated with each Example. Since each run was processing 1,000,000 Examples, this means that the sums were over one million small positive values. The naive method of summing one million small values with errors of about 1% in each addition should yield results that approximate noise. However, the code performs its sums using a long known method invented by Kahan (Kahan, William (January 1965), "Further remarks on reducing truncation errors", Communications of the ACM 8 (1): 40). The method makes it feasible to perform long sums, such as are done for Distance Weighted Scores, or as might be used in computational finance when computing prices of derivative securities using Monte Carlo methods, or for performing deconvolution in image processing algorithms, as will be discussed next.

The Efficiency of this algorithm is similar to that of NN, as discussed earlier. If many Test vectors are processed at once, the machine performs especially efficiently.

Application 3: Removing Motion Blur in Images

In order to gather sufficient light to form an image, camera shutters are often left open for long enough that camera motion can cause blurring. This can happen as a result of camera shake in inexpensive consumer cameras as well as with very expensive but fast moving cameras mounted on satellites or aircraft. If the motion path of the camera is known (or can be computed) then the blur can be substantially removed using various deblurring algorithms. One such algorithm is the Richardson-Lucy method ("RL"), and we show here that embodiments of the present invention can run that algorithm and produce useful results. Following the discussion format above, we discuss criteria of Accuracy and Efficiency.

Algorithm.

The Richardson-Lucy algorithm is well known and widely available. Assume that an image has been blurred using a known kernel. In particular, assume that the kernel is a straight line and that the image has been oriented so that the blur has occurred purely in a horizontal direction. Consider the particular kernel for which the J'th pixel in each row of the blurred image is the uniformly weighted mean of pixels J through J+31 in the original unblurred image.

Accuracy.

Figure 7:
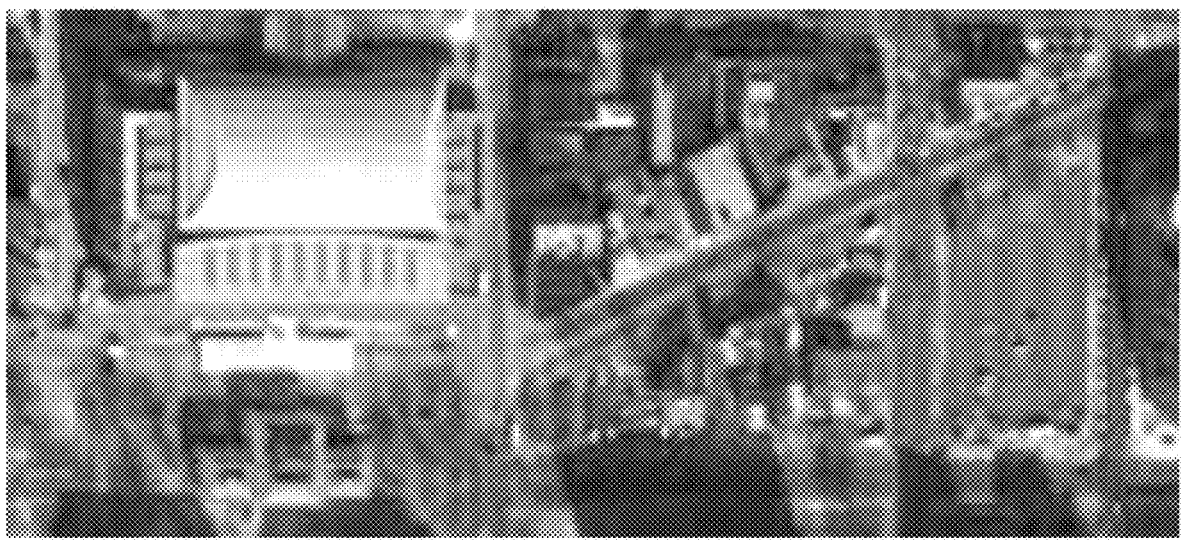
FIG. 7 is an original image.
Figure 8:
FIG. 8 is an image blurred by a blur kernel according to one embodiment of the present invention.
Figure 9:
FIG. 9 is an image produced by Richardson Lucy deconvolution using floating point arithmetic according to one embodiment of the present invention.
Figure 10:
FIG. 10 is an image produced by Richardson Lucy deconvolution using LPHDR floating point arithmetic with added noise (fp+noise) according to one embodiment of the present invention.
Figure 11:
FIG. 11 is an image produced by Richardson Lucy deconvolution using LPHDR logarithmic arithmetic (lns) according to one embodiment of the present invention.

We implemented in the C programming language a straightforward version of the RL method that uses LPHDR arithmetic. The program reads a test image, blurs it using the kernel discussed above, then deblurs it using either fp+noise or lns arithmetic. The RL algorithm computes sums, such as when convolving the kernel with the current approximation of the deblurred image. Our implementation computes these sums using the Kahan method, discussed earlier. FIG. 7 shows the test image in original form. It is a satellite picture of a building used during Barack Obama's inauguration. FIG. 8 shows the image extremely blurred by the kernel. It is difficult to see any particular objects in this image. FIG. 9 shows the result of deblurring using standard floating point arithmetic. FIG. 10 shows the result of deblurring using fp+noise arithmetic, and FIG. 11 shows the result of deblurring using lns arithmetic. In all these cases the image is sufficiently restored that it is possible to recognize buildings, streets, parking lots, and cars.

In addition to displaying the images herein for judgement using the human eye, we computed a numerical measure of deblurring performance. We computed the mean difference, over all pixels in the image, between each original pixel value (a gray scale value from 0 to 255) and the corresponding value in the image reconstructed by the RL method. Those numerical measures are shown below in Table 1:

TABLE 1

| Image type | Mean pixel error |
|---|---|
| Blurred | 32.0 |
| RL using standard floating point | 13.0 |
| RL using fp + noise | 13.8 |
| RL using lns | 14.8 |

These results, together with the subjective but important judgements made by the human eye, show that LPHDR arithmetic provides a substantial and useful degree of deblurring compared to standard floating point arithmetic. Further, in this example we chose an extreme degree of blurring, to better convey the concept and visual impact of the deblurring using LPHDR arithmetic. On more gentle and typical blur kernels, the resulting deblurred images are much closer to the originals than in this case, as can be seen by shrinking the kernel length and running the RL algorithm with LPHDR arithmetic on those more typical cases.

Efficiency.

It is clear to those with ordinary skill in the art that Richardson-Lucy using a local kernel performs only local computational operations. An image to be deblurred can be loaded into the PE array, storing one or more pixels per PE, the deconvolution operation of RL can then be iterated dozens or hundreds of times, and the deblurred image can be read back to the host processor. As long as sufficient iterations are performed, this makes efficient use of the machine.

An extreme form of image deblurring is the Iterative Reconstruction method used in computational tomography. Reconstructing 3D volumes from 2D projections is an extremely computational task. The method discussed above generalizes naturally to Iterative Reconstruction and makes efficient use of the machine.

Among the advantages of embodiments of the invention are one or more of the following.

PEs implemented according to certain embodiments of the present invention may be relatively small for PEs that can do arithmetic. This means that there are many PEs per unit of resource (e.g., transistor, area, volume), which in turn means that there is a large amount of arithmetic computational power per unit of resource. This enables larger problems to be solved with a given amount of resource than does traditional computer designs. For instance, a digital embodiment of the present invention built as a large silicon chip fabricated with current state of the art technology might perform tens of thousand of arithmetic operations per cycle, as opposed to hundreds in a conventional GPU or a handful in a conventional multicore CPU. These ratios reflect an architectural advantage of embodiments of the present invention that should persist as fabrication technology continues to improve, even as we reach nanotechnology or other implementations for digital and analog computing.

Doing arithmetic with few resources generally means, and in the embodiments shown specifically means, that the arithmetic is done using low power. As a result, a machine implemented in accordance with embodiments of the present invention can have extremely high performance with reasonable power (for instance in the tens of watts) or low power (for instance a fraction of a watt) with reasonably high performance. This means that such embodiments may be suitable for the full range of computing, from supercomputers, through desktops, down to mobile computing. Similarly, and since cost is generally associated with the amount of available resources, embodiments of the present invention may provide a relatively high amount of computing power per unit of cost compared to conventional computing devices.

The SIMD architecture is rather old and is frequently discarded as an approach to computer design by those having ordinary skill in the art. However, if the processing elements of a SIMD machine can be made particularly small while retaining important functionality, such as general arithmetic ability, the architecture can be useful. The embodiments presented herein have precisely those qualities.

The discovery that massive amounts of LPHDR arithmetic is useful as a fairly general computing framework, as opposed to the common belief that it is not useful, can be an advantage in any (massively or non-massively) parallel machine design or non-parallel design, not just in SIMD embodiments. It could be used in FPGAs, FPGAs, GPU/SIMT machines, MIMD machines, and in any kind of machine that uses compact arithmetic processing elements to perform large amounts of computation using a small amount of resources (like transistors or volume).

Another advantage of embodiments of the present invention is that they are not merely useful for performing computations efficiently in general, but that they can be used to tackle a variety of real-world problems which are typically assumed to require high-precision computing elements, even though such embodiments include only (or predominantly) low-precision computing elements. Although several examples of such real-world problems have been presented herein, and although we have also had success implementing non-bonded force field computations for molecular dynamics simulation and other tasks, these are merely examples and do not constitute an exhaustive set of the real-world problems that embodiments of the present invention may be used to solve.

The embodiments disclosed above are merely examples and do not constitute limitations of the present invention. Rather, embodiments of the present invention may be implemented in a variety of other ways, such as the following.

For example, embodiments of the present invention may represent values in any of a variety of ways, such as by using digital or analog representations, such as fixed point, logarithmic, or floating point representations, voltages, currents, charges, pulse width, pulse density, frequency, probability, spikes, timing, or combinations thereof. These underlying representations may be used individually or in combination to represent the LPHDR values. LPHDR arithmetic circuits may be implemented in any of a variety of ways, such as by using various digital methods (which may be parallel or serial, pipelined or not) or analog methods or combinations thereof. Arithmetic elements may be connected using various connection architectures, such as nearest 4, nearest 8, hops of varying degree, and architectures which may or may not be rectangular or grid-like. Any method may be used for communication among arithmetic elements, such as parallel or serial, digital or analog or mixed-mode communication. Arithmetic elements may operate synchronously or asynchronously, and may operate globally simultaneously or not. Arithmetic elements may be implemented, for example, on a single physical device, such as a silicon chip, or spread across multiple devices and an embodiment built from multiple devices may have its arithmetic elements connected in a variety of ways, including for example being connected as a grid, torus, hypercube, tree, or other method. Arithmetic elements may be connected to a host machine, if any, in a variety of ways, depending on the cost and bandwidth and other requirements of a particular embodiment. For example there may be many host machines connected to the collection of arithmetic elements.

Although certain embodiments of the present invention are described as being implemented as a SIMD architecture, this is merely an example and does not constitute a limitation of the present invention. For example, embodiments of the present invention may be implemented as reconfigurable architectures, such as but not limited to programmable logic devices, field programmable analog arrays, or field programmable gate array architectures, such as a design in which existing multiplier blocks of an FPGA are replaced with or supplemented by LPHDR arithmetic elements of any of the kinds disclosed herein, or for example in which LPHDR elements are included in a new or existing reconfigurable device design. As another example, embodiments of the present invention may be implemented as a GPU or SIMT-style architecture which incorporates LPHDR arithmetic elements of any of the kinds disclosed herein. For example, LPHDR elements could supplement or replace traditional arithmetic elements in current or new graphics processing unit designs. As yet another example, embodiments of the present invention may be implemented as a MIMD-style architecture which incorporates LPHDR arithmetic elements of any of the kinds disclosed herein. For example, LPHDR arithmetic elements could supplement or replace traditional arithmetic elements in current or new MIMD computing system designs. As yet another example, embodiments of the present invention may be implemented as any kind of machine, including a massively parallel machine, which uses compact arithmetic processing elements to provide large amounts of arithmetic computing capability using a small amount of resources (for example, transistors or area or volume) compared with traditional architectures.

Although certain embodiments of the present invention are described herein as executing software, this is merely an example and does not constitute a limitation of the present invention. Alternatively, for example, embodiments of the present invention may be implemented using microcode or a hardware sequencer or state machine or other controller to control LPHDR arithmetic elements of any of the kinds disclosed herein. Alternatively, for example, embodiments of the present invention may be implemented using hardwired, burned, or otherwise pre-programmed controllers to control LPHDR arithmetic elements of any of the kinds disclosed herein.

Although certain embodiments of the present invention are described herein as being implemented using custom silicon as the hardware, this is merely an example and does not constitute a limitation of the present invention. Alternatively, for example, embodiments of the present invention may be implemented using FPGA or other reconfigurable chips as the underlying hardware, in which the FPGAs or other reconfigurable chips are configured to perform the LPHDR operations disclosed herein. As another example, embodiments of the present invention may be implemented using any programmable conventional digital or analog computing architecture (including those which use high-precision computing elements, including those which use other kinds of non-LPHDR hardware to perform LPHDR arithmetic, and including those which are massively parallel) which has been programmed with software to perform the LPHDR operations disclosed herein. For example, embodiments of the present invention may be implemented using a software emulator of the functions disclosed herein.

As yet another example, embodiments of the present invention may be implemented using 3D fabrication technologies, whether based on silicon chips or otherwise. Some example embodiments are those in which a memory chip has been bonded onto a processor or other device chip or in which several memory and/or processor or other device chips have been bonded to each other in a stack. 3D embodiments of the present invention are very useful as they may be denser than 2D embodiments and may enable 3D communication of information between the processing units, which enables more algorithms to run efficiently on those embodiments compared to 2D embodiments.

Although certain embodiments of the present invention are described herein as being implemented using silicon chip fabrication technology, this is merely an example and does not constitute a limitation of the present invention. Alternatively, for example, embodiments of the present invention may be implemented using technologies that may enable other sorts of traditional digital and analog computing processors or other devices. Examples of such technologies include various nanomechanical and nanoelectronic technologies, chemistry based technologies such as for DNA computing, nanowire and nanotube based technologies, optical technologies, mechanical technologies, biological technologies, and other technologies whether based on transistors or not that are capable of implementing LPHDR architectures of the kinds disclosed herein.

Certain embodiments of the present invention have been described as "massively parallel" embodiments. Although certain embodiments of the present invention may include thousands, millions, or more arithmetic units, embodiments of the present invention may include any number of arithmetic units (as few as one). For example, even an embodiment which includes only a single LPHDR unit may be used within a serial processing unit or other device to provide a significant amount of LPHDR processing power in a small, inexpensive processor or other device.

For certain embodiments of the present invention, even if implemented using only digital techniques, the arithmetic operations may not yield deterministic, repeatable, or the most accurate possible results within the chosen low precision representation. For instance, on certain specific input values, an arithmetic operation may produce a result which is not the nearest value in the chosen representation to the true arithmetic result.

The degree of precision of a "low precision, high dynamic range" arithmetic element may vary from implementation to implementation. For example, in certain embodiments, a LPHDR arithmetic element produces results which include fractions, that is, values greater than zero and less than one. For example, in certain embodiments, a LPHDR arithmetic element produces results which are sometimes (or all of the time) no closer than 0.05% to the correct result (that is, the absolute value of the difference between the produced result and the correct result is no more than one-twentieth of one percent of the absolute value of the correct result). As another example, a LPHDR arithmetic element may produce results which are sometimes (or all of the time) no closer than 0.1% to the correct result. As another example, a LPHDR arithmetic element may produce results which are sometimes (or all of the time) no closer than 0.2% to the correct result. As yet another example, a LPHDR arithmetic element may produce results which are sometimes (or all of the time) no closer than 0.5% to the correct result. As yet further examples, a LPHDR arithmetic element may produce results which are sometimes (or all of the time) no closer than 1%, or 2%, or 5%, or 10%, or 20% to the correct result.

Besides having various possible degrees of precision, implementations may vary in the dynamic range of the space of values they process. For example, in certain embodiments, a LPHDR arithmetic element processes values in a space which may range approximately from one millionth to one million. As another example, in certain embodiments, a LPHDR arithmetic element processes values in a space which may range approximately from one billionth to one billion. As yet another example, in certain embodiments, a LPHDR arithmetic element processes values in a space which may range approximately from one sixty five thousandth to sixty five thousand. As yet further examples, in certain embodiments, a LPHDR arithmetic element processes values in a space which may range from any specific value between zero and one sixty five thousandth up to any specific value greater than sixty five thousand. As yet further examples, other embodiments may process values in spaces with dynamic ranges that may combine and may fall between the prior examples, for example ranging from approximately one billionth to ten million. In all of these example embodiments of the present invention, as well as in other embodiments, the values that we are discussing may be signed, so that the above descriptions characterize the absolute values of the numbers being discussed.

The frequency with which LPHDR arithmetic elements may yield only approximations to correct results may vary from implementation to implementation. For example, consider an embodiment in which LPHDR arithmetic elements can perform one or more operations (perhaps including, for example, trigonometric functions), and for each operation the LPHDR elements each accept a set of inputs drawn from a range of valid values, and for each specific set of input values the LPHDR elements each produce one or more output values (for example, simultaneously computing both sin and cos of an input), and the output values produced for a specific set of inputs may be deterministic or non-deterministic. In such an example embodiment, consider further a fraction F of the valid inputs and a relative error amount E by which the result calculated by an LPHDR element may differ from the mathematically correct result. In certain embodiments of the present invention, for each LPHDR arithmetic element, for at least one operation that the LPHDR unit is capable of performing, for at least fraction F of the possible valid inputs to that operation, for at least one output signal produced by that operation, the statistical mean, over repeated execution, of the numerical values represented by that output signal of the LPHDR unit, when executing that operation on each of those respective inputs, differs by at least E from the result of an exact mathematical calculation of the operation on those same input values, where F is 1% and E is 0.05%. In several other example embodiments, F is not 1% but instead is one of 2%, or 5%, or 10%, or 20%, or 50%. For each of these example embodiments, each with some specific value for F, there are other example embodiments in which E is not 0.05% but instead is 0.1%, or 0.2%, or 0.5%, or 1%, or 2%, or 5%, or 10%, or 20%. These varied embodiments are merely examples and do not constitute limitations of the present invention.

For certain devices (such as computers or processors or other devices) embodied according the present invention, the number of LPHDR arithmetic elements in the device (e.g., computer or processor or other device) exceeds the number, possibly zero, of arithmetic elements in the device which are designed to perform high dynamic range arithmetic of traditional precision (that is, floating point arithmetic with a word length of 32 or more bits). If NL is the total number of LPHDR elements in such a device, and NH is the total number of elements in the device which are designed to perform high dynamic range arithmetic of traditional precision, then NL exceeds T(NH), where T( ) is some function. Any of a variety of functions may be used as the function T( ). For example, in certain embodiments, T(NH) may be twenty plus three times NH, and the number of LPHDR arithmetic elements in the device may exceed twenty more than three times the number of arithmetic elements in the device, if any, designed to perform high dynamic range arithmetic of traditional precision. As another example, in certain embodiments, the number of LPHDR arithmetic elements in the device may exceed fifty more than five times the number of arithmetic elements in the device, if any, designed to perform high dynamic range arithmetic of traditional precision. As yet another example, in certain embodiments, the number of LPHDR arithmetic elements in the device may exceed one hundred more than five times the number of arithmetic elements in the device, if any, designed to perform high dynamic range arithmetic of traditional precision. As yet another example, in certain embodiments, the number of LPHDR arithmetic elements in the device may exceed one thousand more than five times the number of arithmetic elements in the device, if any, designed to perform high dynamic range arithmetic of traditional precision. As yet another example, in certain embodiments, the number of LPHDR arithmetic elements in the device may exceed five thousand more than five times the number of arithmetic elements in the device, if any, designed to perform high dynamic range arithmetic of traditional precision. Certain embodiments of the present invention may be implemented within a single physical device, such as but not limited to a silicon chip or a chip stack or a chip package or a circuit board, and the number NL of LPHDR elements in the physical device and the number NH of elements designed to perform high dynamic range arithmetic of traditional precision in the physical device may be the total counts of the respective elements within that physical device. Certain embodiments of the present invention may be implemented in a computing system including more than one physical device, such as but not limited to a collection of silicon chips or chip stacks or chip packages or circuit boards coupled to and communicating with each other using any means (such as a bus, switch, any kind of network connection, or other means of communication), and in this case the number NL of LPHDR elements in the computing system and the number NH of elements designed to perform high dynamic range arithmetic of traditional precision in the computing system may be the total counts of the respective elements within all those physical devices jointly.

Certain embodiments of the present invention may constitute, or may be part of, processors, which are devices capable of executing software to perform computations. Such processors may include mechanisms for storing software, for using the software to determine what operations to perform, for performing those operations, for storing numerical data, for modifying data according to the software specified operations, and for communicating with devices connected to the processor. Processors may be reconfigurable devices, such as, without limitation, field programmable arrays. Processors may be co-processors to assist host machines or may be capable of operating independently of an external host. Processors may be formed as a collection of component host processors and co-processors of various types, such as CPUs, GPUs, FPGAs, or other processors or other devices, which in the art may be referred to as a heterogeneous processor design or heterogeneous computing system, some or all of which components might incorporate the same or distinct varieties of embodiments of the present invention.

Embodiments of the present invention may, however, be implemented in devices in addition to or other than processors. For example, a computer including a processor and other components (such as memory coupled to the processor by a data path), wherein the processor includes components for performing LPHDR operations in any of the ways disclosed herein, is an example of an embodiment of the present invention. More generally, any device or combination of devices, whether or not falling within the meaning of a "processor," which performs the functions disclosed herein may constitute an example of an embodiment of the present invention.

More generally, any of the techniques described above may be implemented, for example, in hardware, software tangibly stored on a computer-readable medium, firmware, or any combination thereof. The techniques described above may be implemented in one or more computer programs executing on a programmable computer including a processor, a storage medium readable by the processor (including, for example, volatile and non-volatile memory and/or storage elements), at least one input device, and at least one output device. Program code may be applied to input entered using the input device to perform the functions described and to generate output. The output may be provided to one or more output devices.

Each computer program within the scope of the claims below may be implemented in any programming language, such as assembly language, machine language, a high-level procedural programming language, or an object-oriented programming language. The programming language may, for example, be a compiled or interpreted programming language.

Each such computer program may be implemented in a computer program product tangibly embodied in a machine-readable storage device for execution by a computer processor. Method steps of the invention may be performed by a computer processor executing a program tangibly embodied on a computer-readable medium to perform functions of the invention by operating on input and generating output. Suitable processors include, by way of example, both general and special purpose microprocessors. Generally, the processor receives instructions and data from a read-only memory and/or a random access memory. Storage devices suitable for tangibly embodying computer program instructions include, for example, all forms of non-volatile memory, such as semiconductor memory devices, including EPROM, EEPROM, and flash memory devices; magnetic disks such as internal hard disks and removable disks; magneto-optical disks; and CD-ROMs. Any of the foregoing may be supplemented by, or incorporated in, specially-designed ASICs (application-specific integrated circuits) or FPGAs (Field-Programmable Gate Arrays). A computer can generally also receive programs and data from a storage medium such as an internal disk (not shown) or a removable disk. These elements will also be found in a conventional desktop or workstation computer as well as other computers suitable for executing computer programs implementing the methods described herein, which may be used in conjunction with any digital print engine or marking engine, display monitor, or other raster output device capable of producing color or gray scale pixels on paper, film, display screen, or other output medium.

The invention claimed is:

1. A computing system, comprising:
   a host computer;
   a computing chip comprising:
   a processing element array comprising a first edge processing element positioned at a first edge of the processing element array, a second edge processing element positioned at the first edge of the processing element array, a first interior processing element positioned at a first location in an interior of the processing element array, and a second interior processing element positioned at a second location in the interior of the processing element array;
   a first processing element connection connecting the first edge processing element with the first interior processing element;
   a second processing element connection connecting the second edge processing element with the second interior processing element;
   an input-output unit connected to the first edge processing element and the second edge processing element;
   a first memory local to the first edge processing element;
   a second memory local to the second edge processing element;
   a third memory local to the first interior processing element; and,
   a fourth memory local to the second interior processing element;
   wherein the first edge processing element comprises a first arithmetic unit;
   wherein the second edge processing element comprises a second arithmetic unit;
   wherein the first interior processing element comprises a third arithmetic unit; and
   wherein the second interior processing element comprises a fourth arithmetic unit; and,
   a host connection at least partially connecting the input-output unit with the host computer;
   wherein the first, second, third and fourth arithmetic units each comprises a corresponding multiplier circuit adapted to receive as a first input to the corresponding multiplier circuit a first floating point value having a first binary mantissa of width no more than 11 bits and a first binary exponent of width at least 6 bits, and to receive as a second input to the corresponding multiplier circuit a second floating point value having a second binary mantissa of width no more than 11 bits and a second binary exponent of width at least 6 bits.

2. The computing system of claim 1, wherein the computing chip further comprises a control unit connected to the processing element array, the control unit comprising circuitry adapted to decode at least one instruction received from the host computer via the input-output unit, and to send at least one control signal to the processing element array to cause the processing element array to operate according to the at least one instruction.

3. The computing system of claim 2, wherein the computing chip further comprises an instruction memory adapted to store the at least one instruction received from the host computer via the input-output unit, wherein the control unit is further adapted to retrieve the at least one instruction from the instruction memory.

4. The computing system of claim 1, wherein said host computer is programmed to provide instructions to said computing chip that, when executed, cause said processing element array to perform an operation whose output is used to identify at least one image, from a plurality of images to be searched, that is similar to at least one input image.

5. The computing system of claim 1, wherein the width of each first binary mantissa is no more than 10 bits plus a first sign bit, and wherein the width of each second binary mantissa is no more than 10 bits plus a second sign bit.

6. The computing system of claim 5, wherein the width of each first binary exponent is at least 5 bits plus a third sign bit and wherein the width of each second binary exponent is at least 5 bits plus a fourth sign bit.

7. A computing system, comprising:
a host computer;
a computing chip comprising:
a processing element array comprising a plurality of first processing elements, wherein the plurality of first processing elements is no less than 5000 in number, wherein each of a first subset of the plurality of first processing elements is positioned at a first edge of the processing element array, and wherein each of a second subset of the plurality of first processing elements is positioned in the interior of the processing element array;
an input-output unit connected to each of the first subset of the plurality of first processing elements;
a plurality of processing element connections, each processing element connection connecting one of the plurality of first processing elements with another of the plurality of first processing elements, wherein each of the plurality of first processing elements is connected to at least one other of the plurality of first processing elements by at least one of the plurality of processing element connections;
a plurality of memory units, wherein each of the plurality of first processing elements is associated with a corresponding one of the plurality of memory units, and wherein each of the plurality of memory units is local to its associated one of the plurality of first processing elements; and,
a plurality of arithmetic units, wherein each of the plurality of first processing elements has positioned therein at least one of the plurality of arithmetic units; and,
a host connection at least partially connecting the input-output unit with the host computer;
wherein the plurality of arithmetic units each comprises a first corresponding multiplier circuit adapted to receive as a first input to the first corresponding multiplier circuit a first floating point value having a first binary mantissa of width no more than 11 bits and a first binary exponent of width at least 6 bits, and to receive as a second input to the first corresponding multiplier circuit a second floating point value having a second binary mantissa of width no more than 11 bits and a second binary exponent of width at least 6 bits.

8. The computing system of claim 7,
wherein the computing chip further comprises a plurality of second processing elements, wherein the plurality of second processing elements each comprises a second corresponding multiplier circuit adapted to receive as inputs to the second corresponding multiplier circuit two floating point values each of width at least 32 bits;
wherein, other than the plurality of second processing elements, the computing chip has no other processing element that comprises a multiplier circuit adapted to receive as inputs to the multiplier circuit two floating point values each of width at least 32 bits; and
wherein the plurality of first processing elements is greater in number, by at least 100, than the plurality of second processing elements.

9. The computing system of claim 7, wherein the plurality of memory units each comprises a corresponding register.

10. The computing system of claim 8, wherein said host computer is programmed to provide instructions to said computing chip that, when executed, cause said processing element array to perform an operation whose output is used to identify at least one image, from a plurality of images to be searched, that is similar to at least one input image.

11. The computing system of claim 8, wherein an aggregate maximum bandwidth of the plurality of processing element connections exceeds a maximum bandwidth of the host connection.

12. The computing system of claim 11, wherein the computing chip further comprises a control unit connected to the processing element array, the control unit comprising circuitry adapted to decode at least one instruction received from the host computer via the input-output unit, and to send at least one control signal to the processing element array to cause the processing element array to operate according to the at least one instruction.

13. The computing system of claim 12, wherein the computing chip further comprises an instruction memory adapted to store the at least one instruction received from the host computer via the input-output unit, wherein the control unit is further adapted to retrieve the at least one instruction from the instruction memory.

14. The computing system of claim 7, wherein the width of each first binary mantissa is no more than 10 bits plus a first sign bit, and wherein the width of each second binary mantissa is no more than 10 bits plus a second sign bit.

15. The computing system of claim 14, wherein the width of each first binary exponent is at least 5 bits plus a third sign bit and wherein the width of each second binary exponent is at least 5 bits plus a fourth sign bit.

16. A computing system, comprising:
a host computer;
a computing chip comprising:
a processing element array comprising a first edge processing element positioned at a first edge of the processing element array, a second edge processing element positioned at the first edge of the processing element array, a first interior processing element positioned at a first location in the interior of the processing element array, and a second interior processing element positioned at a second location in the interior of the processing element array;
a first processing element connection connecting the first edge processing element with the first interior processing element;
a second processing element connection connecting the second edge processing element with the second interior processing element;
an input-output unit connected to the first edge processing element and the second edge processing element;
a first memory local to the first edge processing element;
a second memory local to the second edge processing element;
a third memory local to the first interior processing element; and
a fourth memory local to the second interior processing element;
wherein the first edge processing element comprises a first arithmetic unit;
wherein the second edge processing element comprises a second arithmetic unit;
wherein the first interior processing element comprises a third arithmetic unit; and
wherein the second interior processing element comprises a fourth arithmetic unit;
a host connection at least partially connecting the input-output unit with the host computer;
an external edge processing element external to the computing chip;
an external input-output unit external to the computing chip; and,
a fifth memory local to the external edge processing element;
wherein the external edge processing element comprises a fifth arithmetic unit;
wherein the first, second, third, fourth, and fifth arithmetic units each comprises a first corresponding multiplier circuit adapted to receive as a first input to the first corresponding multiplier circuit a first floating point value having a first binary mantissa of width no more than 11 bits and a first binary exponent of width at least 6 bits, and to receive as a second input to the first corresponding multiplier circuit a second floating point value having a second binary mantissa of width no more than 11 bits and a second binary exponent of width at least 6 bits; and
wherein the first edge processing element is connected with the external edge processing element through the input-output unit and the external input-output unit.

17. The computing system of claim 16, wherein the first edge processing element is connected with the external edge processing element using a torus interconnect.

18. The computing system of claim 16,
wherein the processing element array further comprises a plurality of first additional processing elements and a plurality of first additional arithmetic units, each of the plurality of first additional processing elements having positioned therein at least one of the plurality of first additional arithmetic units;
wherein the plurality of first additional arithmetic units each comprises a second corresponding multiplier circuit adapted to receive as a third input to the second corresponding multiplier circuit a third floating point value having a third binary mantissa of width no more than 11 bits and a third binary exponent of width at least 6 bits, and to receive as a fourth input to the second corresponding multiplier circuit a fourth floating point value having a fourth binary mantissa of width no more than 11 bits and a fourth binary exponent of width at least 6 bits;
wherein the computing chip further comprises a plurality of second additional processing elements, wherein the plurality of second additional processing elements each comprises a third corresponding multiplier circuit adapted to receive as inputs to the third corresponding multiplier circuit two floating point values each of width at least 32 bits;
wherein other than the second additional processing elements the computing chip has no other processing element that comprises a multiplier circuit adapted to receive as inputs to the multiplier circuit two floating point values each of width at least 32 bits; and,
wherein the plurality of first additional processing elements is greater in number, by at least 100, than the plurality of second additional processing elements.

19. The computing system of claim 18, wherein said host computer is programmed to provide instructions to said computing chip that, when executed, cause said processing element array to perform an operation whose output is used to identify at least one image, from a plurality of images to be searched, that is similar to at least one input image.

20. The computing system of claim 18, wherein the computing chip further comprises a control unit connected to the processing element array, the control unit comprising circuitry adapted to decode at least one instruction received from the host computer via the input-output unit, and to send at least one control signal to the processing element array to cause the processing element array to operate according to the at least one instruction.

21. The computing system of claim 20, wherein the computing chip further comprises an instruction memory adapted to store the at least one instruction received from the host computer via the input-output unit, wherein the control unit is further adapted to retrieve the at least one instruction from the instruction memory.

22. The computing system of claim 16, wherein the width of each first binary mantissa is no more than 10 bits plus a first sign bit, and wherein the width of each second binary mantissa is no more than 10 bits plus a second sign bit.

23. The computing system of claim 22, wherein the width of each first binary exponent is at least 5 bits plus a third sign bit and wherein the width of each second binary exponent is at least 5 bits plus a fourth sign bit.

24. The computing system of claim 18, wherein the width of each first binary mantissa is no more than 10 bits plus a first sign bit, wherein the width of each second binary mantissa is no more than 10 bits plus a second sign bit, wherein the width of each third binary mantissa is no more than 10 bits plus a third sign bit, and wherein the width of each fourth binary mantissa is no more than 10 bits plus a fourth sign bit.

25. The computing system of claim 24, wherein the width of each first binary exponent is at least 5 bits plus a fifth sign bit, wherein the width of each second binary exponent is at least 5 bits plus a sixth sign bit, wherein the width of each third binary exponent is at least 5 bits plus a seventh sign bit, and wherein the width of each fourth binary exponent is at least 5 bits plus an eighth sign bit.

* * * * *